(12) United States Patent
Ishii

(10) Patent No.: US 7,759,743 B2
(45) Date of Patent: Jul. 20, 2010

(54) SEMICONDUCTOR MEMORY DEVICE HAVING LAYOUT AREA REDUCED

(75) Inventor: Yuichiro Ishii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 67 days.

(21) Appl. No.: 12/255,999

(22) Filed: Oct. 22, 2008

(65) Prior Publication Data

US 2009/0065874 A1 Mar. 12, 2009

Related U.S. Application Data

(63) Continuation of application No. 11/797,806, filed on May 8, 2007, now Pat. No. 7,453,126.

(30) Foreign Application Priority Data

May 11, 2006 (JP) .............................. 2006-132762

(51) Int. Cl.
*H01L 29/26* (2006.01)
*H01L 29/94* (2006.01)
*H01L 31/062* (2006.01)
*H01L 31/113* (2006.01)
*H01L 31/119* (2006.01)

(52) U.S. Cl. ..................... 257/393; 257/903

(58) Field of Classification Search ......... 257/393–400, 257/903–904, E27.098
See application file for complete search history.

(56) References Cited

U.S. PATENT DOCUMENTS

| 5,352,916 A | 10/1994 | Kiyono et al. |
| 6,333,877 B1 | 12/2001 | Nagaoka et al. |
| 6,657,243 B2 * | 12/2003 | Kumagai et al. ............ 257/903 |

* cited by examiner

*Primary Examiner*—Cuong Q Nguyen
(74) *Attorney, Agent, or Firm*—McDermott Will & Emery LLP

(57) ABSTRACT

A metal supplying an N well voltage is provided in a first metal interconnection layer. The metal is electrically coupled to an active layer provided in an N well region by shared contacts so that the N well voltage is supplied to the N well region. A metal supplying a P well voltage is provided in a third metal interconnection layer. The metal supplying the N well voltage is formed using a metal in the first metal interconnection layer and thus does not require a piling region to the underlayer, and only a piling region to the underlayer of the metal for the P well voltage needs to be secured. Therefore, the length in the Y direction of a power feed cell can be reduced thereby reducing the layout area of the power feed cell.

2 Claims, 18 Drawing Sheets

SEMICONDUCTOR MEMORY DEVICE HAVING LAYOUT AREA REDUCED

RELATED APPLICATIONS

This application is a Continuation of U.S. application Ser. No. 11/797,806, filed May 8, 2007 now U.S. Pat. No. 7,453,126, claiming priority of Japanese Application No. 2006-132762, filed May 11, 2006, the entire contents of each of which are hereby incorporated by reference.

BACKGROUND OF THE INVENTION

1. Field of the Invention

The present invention relates to a semiconductor memory device, and more particularly to a cell that supplies a prescribed voltage to a well of a memory cell of an SRAM (Static Random Access Memory).

2. Description of the Background Art

In recent years, with widespread use of mobile terminal equipment, digital signal processing in which bulk data such as sounds or images is processed at high speed has been increasingly important. SRAM which is capable of high-speed access processing holds an important place as a semiconductor memory device to be mounted on such mobile terminal equipment.

SRAM has a memory cell configured with a P-channel MOS transistor and an N-channel MOS transistor which are formed in an N well region and a P well region, respectively.

FIG. 16 schematically shows a general memory array.

Referring to FIG. 16, the memory array has memory cells MC integrated and arranged in a matrix.

Power feed to the N well region and the P well region of memory cell MC (well feed) may be performed for each memory cell. In the case where power is fed individually for each memory cell, however, a region for interconnection for well feed has to be reserved for each and therefore an individual area of a memory cell MC is increased. Accordingly, the area of the entire memory array is increased.

Therefore, usually, well feed is performed on the basis of a plurality of cells rather than being performed individually for each memory cell.

Here, as an example, a cell PMC for executing well feed every four memory cells (also simply referred to as a power feed cell hereinafter) is provided on each column along the Y direction. A plurality of power feed cells are provided along the X direction to configure a power feed cell row. FIG. 16 shows two power feed cell rows each comprised of a plurality of power feed cells.

FIG. 17 is a circuit configuration diagram of a memory cell MC.

Referring to FIG. 17, memory cell MC includes transistors PT1, PT2, NT1-NT4. Here, transistors PT1, PT2 are P-channel MOS transistors, by way of example, and transistors NT1-NT4 are N-channel MOS transistors, by way of example.

Here, transistors NT3, NT4 are a pair of access transistors provided between a storage node and a bit line BL and a complementary bit line /BL paired with bit line BL, respectively. Transistors PT1, PT2 are a pair of load transistors each provided between a storage node and a high-side power supply voltage. Transistors NT1, NT2 are a pair of driver transistors each provided between a storage node and a low-side power supply voltage. These load transistors and driver transistor form two inverters in memory cell MC.

Specifically, transistor PT1 is arranged between a high-side power supply voltage ARVDD (also referred to as voltage ARVDD hereinafter) and a storage node Nd1 and has the gate electrically coupled to a storage node Nd2. Transistor NT1 is arranged between storage node Nd1 and a low-side power supply voltage ARVSS (also referred to as voltage VSS hereinafter) and has the gate electrically coupled to storage node Nd2. Transistor PT2 is arranged between voltage ARVDD and storage node Nd2 and has the gate electrically coupled to storage node Nd1. Transistor NT2 is arranged between storage node Nd2 and voltage ARVSS and has the gate electrically coupled to storage node Nd1.

Transistors PT1, PT2 and NT1, NT2 form two CMOS inverters for holding signal levels at storage nodes N1 and N2, which are cross-coupled to configure a CMOS-type flip-flop.

Transistor NT3 is arranged between storage node Nd1 and bit line BL and has the gate electrically coupled to a word line WL. Transistor NT4 is arranged between storage node Nd2 and bit line /BL and has the gate electrically coupled to word line WL.

Data writing/reading for storage nodes Nd1 and Nd2 are executed by transistors NT3 and NT4 turning on in response to activation of word line WL to allow storage nodes Nd1 and Nd2 to be electrically coupled to bit lines BL and /BL, respectively.

For example, when word line WL is inactivated to turn off transistors NT3, NT4, one of the N-channel MOS transistor and the P-channel MOS transistor which configure each CMOS inverter turns on, according to the data level held at storage nodes Nd1 and Nd2. Accordingly, according to the data level held in memory cell MC, storage nodes Nd1 and Nd2 are electrically coupled to one and the other of the high-side power supply voltage corresponding to an "H" level of data and the low-side power supply voltage corresponding to an "L" level of data.

Then, it becomes possible to hold data in memory cell MC in the standby state in which word line WL is inactivated.

Furthermore, in this configuration, a high-side power supply voltage VDDB (also referred to as N well voltage VDDB hereinafter) is supplied to the back gates, namely the N well regions of transistors PT1, PT2 which are P-channel MOS transistors, and a low-side power supply voltage VSSB (also referred to as P well voltage VSSB) is supplied to the back gates, namely the P well regions of transistors NT1-NT4 which are N-channel MOS transistors. In other words, N well voltage VDDB is supplied to the N well region forming a P-channel MOS transistor of memory cell MC, and P well voltage VSSB is supplied to the P well region forming an N-channel MOS transistor.

In particular, in this configuration, high-side power supply voltages ARVDD and VDDB as well as low-side power supply voltages ARVSS and VSSB can independently be supplied. In other words, voltages ARVDD, ARVSS for driving memory cell MC and N well voltages VDDB, VSSB for well feed are independently supplied, so that the well voltage is enhanced thereby improving software error resistance.

FIG. 18 illustrates a layout pattern of memory cells and power feed cells of a conventional memory array.

Referring to FIG. 18, here, power feed cell PMCP is provided between two memory cells MC, and four memory cells MC and two power feed cells PMCP are shown. Furthermore, a P well region and an N well region in which active regions for forming memory cell MC and power feed cell PMCP are disposed are alternately disposed in the row direction, namely in the X direction to extend in the column direction, namely in the Y direction.

The layout of memory cell MC and power feed cell PMCP which is reflective-symmetric with respect to a boundary region is repeatedly arranged, and memory cell MC and power feed cell PMCP have active regions and interconnection lines disposed in reflective symmetry in the Y direction. Here, although not shown, in a memory cell column, active regions and interconnection lines are disposed in reflective symmetry in the X direction between adjacent memory cells MC.

Although memory cell MC and power feed cell PMCP are different in interconnection and the like, an active region and an interconnection line are disposed in power feed cell PMCP using a similar layout pattern as memory cell MC in order to make the layout patterns uniform. In other words, in the column direction, power feed cell PMCP is formed using a dummy layout pattern similar to the layout pattern of memory cell MC to have a reflective-symmetric relation in the X direction with the adjacent memory cell MC.

The use of this layout pattern makes it possible to shape uniform layout patterns having reduced pattern variations with the continuity of layout patterns of the cell layout being kept.

FIG. 19 illustrates a part of the cell layout shown in FIG. 18.

Referring to FIG. 19, shown here are two memory cells MC and a power feed cell PMCP arranged therebetween in a memory cell column.

In the following, a layout pattern of memory cell MC and power feed cell PMCP will be described.

FIG. 20 illustrates a layout pattern of memory cell MC.

FIG. 20($a$) shows a layout pattern of an underlying portion of memory cell MC.

Referring to FIG. 20($a$), an N-type N well region is disposed to extend linearly in the Y direction, and P-type P well regions are disposed on opposite sides of the N well region. A load transistor is formed in the N well region, and an access transistor and a driver transistor are provided in the P well region. These N well region and P well regions are arranged to extend in the column direction, and memory cells MC aligned in a line are formed using these N well region and P well regions.

Specifically, in the P well region, a rectangular-shaped, transistor formation active region (also simply referred to as an active region hereinafter) 100 is formed to extend in the Y direction. A polysilicon interconnection line 105 and a polysilicon interconnection line 104 for forming a storage node are disposed in the X direction each to intersect active region 100. Polysilicon interconnection line 105 is disposed to extend into the N well region. Polysilicon interconnection line 104 is disposed in the P well region.

A contact 110 for forming a storage node is disposed between polysilicon interconnection lines 104 and 105. A contact 111 for establishing contact with bit line BL as described later is disposed in an outer region of active region 100 which is divided by polysilicon interconnection line 105. In addition, a contact 109 for establishing contact with an interconnection line receiving voltage ARVSS as described later is disposed in an outer region of active region 100 which is divided by polysilicon interconnection line 104.

Furthermore, a contact 108 for forming a gate region and establishing contact with word line WL as describe later is disposed above polysilicon interconnection line 104.

In the N well region, rectangular-shaped active regions 102, 103 extending in the Y direction are arranged spaced apart from each other and displaced from each other in the Y direction. Polysilicon interconnection line 105 is disposed to extend in the X direction across active region 102. A polysilicon interconnection line 107 is disposed to extend in the X direction across active region 103 as well. A contact 112 for establishing contact with an interconnection line receiving voltage ARVDD is disposed in an outer region of active region 102 which is divided by polysilicon interconnection line 105. Furthermore, a contact 115 for establishing contact with an interconnection line receiving voltage ARVDD is disposed in an outer region of active region 103 which is divided by polysilicon interconnection line 107.

In active region 102, a shared contact 113 is formed which establishes contact with polysilicon interconnection line 107 in common with the active region gate-isolated by polysilicon interconnection line 105. In active region 103, a shared contact 114 is formed which establishes contact with polysilicon interconnection line 105 in common with the active region gate-isolated by polysilicon interconnection line 107. Formation of this shared contact 113 allows electrical connection to both active region 102 and polysilicon interconnection line 107 with one contact without using one-layer metal. Furthermore, formation of shared contact 114 allows electrical connection to both active region 103 and polysilicon interconnection line 105 with one contact without using one-layer metal.

In the other P well region, a rectangular-shaped active region 101 is formed to extend in the Y direction. A polysilicon interconnection line 106 and polysilicon interconnection line 107 provided extending from the N well region are disposed in the X direction, each intersecting active region 101. Polysilicon interconnection line 106 is disposed in the P well region.

A contact 117 for forming the other storage node is disposed between polysilicon interconnection lines 106 and 107. A contact 116 for establishing contact with the complementary bit line /BL as described later is disposed in an outer region of active region 101 which is divided by polysilicon interconnection line 107. Furthermore, a contact 118 for establishing contact with an interconnection line receiving voltage ARVSS as described later is disposed in an outer region of active region 101 which is divided by polysilicon interconnection line 106. In addition, a contact 119 for forming a gate region and establishing contact with word line WL as described later is disposed above polysilicon interconnection line 106.

The positional relation between the contacts for bit lines BL, /BL and the contacts receiving voltage ARVSS is symmetric between active regions 100 and 101.

Here, the region surrounded by the dotted line as shown is a region in which P-type ion implantation is performed on active regions 102, 103 of N well regions in order to form impurity regions of P-channel MOS transistors. A region not surrounded by a dotted line is subjected to N-type ion implantation.

FIG. 20($b$) shows a layout pattern up to a first metal interconnection layer (also referred to as the first layer) of memory cell MC.

As shown in FIG. 20($b$), in the first layer, a metal 123 is provided electrically connected to contact 108. Furthermore, a metal 122 is provided electrically connected to contact 111. In addition, a metal 128 is provided electrically coupling contact 110 forming a storage node and shared contact 113 to each other. A metal 127 is provided electrically connected to contact 112. A metal 129 is provided electrically coupling contact 117 forming a storage node and shared contact 114 to each other. Additionally provided are a metal 126 electrically connected to contact 118, a metal 120 connected to contact 119, and a metal 121 connected to contact 116.

FIG. 20($c$) shows a layout pattern up to a second metal interconnection layer (also referred to as the second layer) of memory cell MC.

As shown in FIG. 20(c), in the second layer, a metal 131 is provided electrically coupled to metal 122 through a contact 130. Furthermore, a metal 133 is provided electrically coupled to metal 123 through a contact 132. In addition, a metal 135 is provided electrically coupled to metal 124 through a contact 134. Furthermore, a shared metal 137 is provided electrically coupled to metals 127 and 125 through contacts 136 and 138, respectively. Moreover, a metal 140 is provided electrically coupled to metal 126 through a contact 139. In addition, a metal 141 is provided electrically coupled to metal 120 through a contact 142. In addition, a metal 144 is provided electrically coupled to metal 121 through a contact 143.

Here, metal 135 and metal 140 form bit lines BL and /BL, respectively. Metal 137 forms a power supply line which supplies voltage ARVDD.

FIG. 20(d) shows a layout pattern up to a third metal interconnection layer (also referred to as the third layer) of memory cell MC.

As shown in FIG. 20(d), in the third layer, a metal 151 is provided electrically coupled to metal 131 through a contact 150. Furthermore, a metal 154 is provided electrically coupled to metal 133 through a contact 152 and coupled to metal 141 through a contact 153. In addition, a metal 156 is provided electrically coupled to metal 144 through a contact 155.

Here, metal 151 forms a power supply line supplying voltage ARVSS. Metal 154 forms word line WL. Furthermore, metal 156 forms a power supply line supplying voltage ARVSS.

In other words, power supply lines and bit lines BL, /BL and word line WL are formed using the second and third metal interconnection layers.

FIG. 21 illustrates a layout pattern of a conventional power feed cell PMCP.

FIG. 21(a) shows a layout pattern of an underlying portion of power feed cell PMCP.

Referring to FIG. 21(a), an N-type N well region is disposed to linearly extend in the Y direction, and P-type P well regions are disposed on opposite sides of the N well region. These N well region and P well regions are shared with memory cell MC and arranged extending in the column direction. In these N well region and P well regions, a power feed cell for performing well feed is formed using transistor formation active regions formed as a dummy layout pattern.

Specifically, in the middle region of the P well region of the power feed cell, a dummy active region 207 for feeding a well voltage is disposed. Furthermore, a dummy active region 208 for feeding a well voltage is disposed similarly in the middle portion of the other P well region. In addition, a dummy active region 204 for feeding a well voltage is disposed in the middle portion of the N well region.

Then, in the upper region, in a boundary region between the upper, adjacent memory cell MC and power feed cell which constitute the same column, the aforementioned active region 100 of memory cell MC in the column direction is shown. As described above, the layout patterns of memory cells MC adjacent in the memory cell column are formed in reflective symmetry along the X direction, and active region 100 is disposed to extend along the Y-axis direction. Here, to form a power feed cell, active region 100 is configured to be disposed not extending in the power feed cell. Similarly, active regions 103 and 101 are also configured to be disposed not extending in the power feed cell.

Similarly, in the lower region, in a boundary region between the lower, adjacent memory cell MC and the power feed cell which constitute the same column on the lower side, an active region 200 for forming the lower adjacent memory cell MC is shown. As described above, to form a power feed cell, active region 200 is configured to be disposed not extending in the power feed cell. Similarly, active regions 203, 201 are also configured to be disposed not extending in the power feed cell.

Then, a dummy polysilicon interconnection line is disposed in order to keep the continuity of the layout pattern. Specifically, dummy polysilicon interconnection lines 222-225 are provided along the X direction in reflective symmetry with the layout pattern of the adjacent memory cell MC. In the upper region, polysilicon interconnection line 225 is disposed along the X direction in an end region of active region 100, and polysilicon interconnection line 224 is disposed to extend along the X direction in end regions of active regions 103 and 101. On the other hand, in the lower region, polysilicon interconnection line 223 is disposed to extend along the X direction in an end region of active region 201, and polysilicon interconnection line 222 is disposed to extend along the X direction in end regions of active regions 200, 203.

Then, contacts electrically coupled to polysilicon interconnection lines 222-225 are disposed to keep continuity of the layout pattern.

Specifically, a shared contact 219 is disposed which establishes a shared contact for polysilicon interconnection line 222 and dummy active region 204. A contact 217 is disposed for polysilicon interconnection line 223. Furthermore, a shared contact 216 is disposed which establishes a shared contact for polysilicon interconnection line 224 and dummy active region 204. A contact 213 is disposed for polysilicon interconnection line 225.

Then, in dummy active region 207, a contact 209 is disposed for establishing contact with a power supply line supplying P well voltage VSSB to be fed to the P well. In dummy active region 204, a contact 210 is disposed for establishing contact with a power supply line supplying N well voltage VDDB to be fed to the N well. In dummy active region 208, a contact 211 is disposed for establishing contact with a power supply line supplying P well voltage VSSB to be fed to the P well.

Here, the region surrounded with the dotted line as shown is a region in which P-type ion implantation is performed on active regions 207, 208 in the P well regions. It is noted that the region not surrounded with a dotted line is a region subjected to N-type ion implantation.

FIG. 21(b) shows a layout pattern up to the first metal interconnection layer of power feed cell PMCP.

As shown in FIG. 21(b), in the first layer, a metal 236 is provided which is electrically connected to contact 213 and contact 209. In addition, a metal 235 is provided which is electrically connected to shared contacts 216, 219 and contact 210. In addition, a metal 231 is provided which is electrically connected to contact 211 and contact 217.

In the upper region, in the boundary region between the upper adjacent memory cell MC and the power feed cell which constitute the same column, the metals having the aforementioned active regions 100, 101, 103 of memory cell MC in the column direction connected through the contacts are denoted by the same reference characters and are similar to those illustrated in FIG. 20(b). Therefore, a detailed description thereof will not be repeated.

Similarly, in the lower region, in the boundary region between the lower adjacent memory cell MC and the power feed cell which constitute the same column on the lower side, active region 200 for forming the lower adjacent memory cell MC is shown and is electrically coupled to a metal 234 through a contact 221. Active region 203 is electrically coupled to a metal 233 through a contact 220. Active region 201 is electrically coupled to a metal 232 through a contact 218.

FIG. 21(c) shows a layout pattern up to the second metal interconnection layer of power feed cell PMCP.

As shown in FIG. 21(c), in the second layer, a metal 255 is provided which is electrically coupled to metal 235 through a contact 254. Furthermore, a metal 253 is provided which is electrically coupled to metal 236 through a contact 252. In addition, a metal 243 is provided which is electrically coupled to metal 231 through a contact 242. Moreover, a metal 245 is provided which is electrically coupled to metal 231 through a contact 244. This metal 245 is a dummy metal formed in accordance with the same layout pattern as metals 253, 255, 243.

As for the upper region, in the boundary region between the upper adjacent memory cell MC and the power feed cell which constitute the same column, metal 135 forming bit line BL electrically coupled through contact 134 of memory cell MC as illustrated in FIG. 20(c) is disposed to extend along the Y direction. Furthermore, metal 137 forming a power supply line supplying voltage ARVDD electrically coupled through contact 138 of memory cell MC is disposed to extend along the Y direction. Similarly, metal 140 forming bit line /BL of memory cell MC is disposed to extend along the Y direction.

Similarly, in the lower region, in the boundary region between the lower adjacent memory cell MC and the power feed cell which constitute the same column on the lower side, metal 234 and a metal 257 are electrically coupled to each other through a contact 256. Furthermore, metal 233 and metal 137 are electrically coupled to each other through a contact 249. In addition, metal 232 and metal 140 are electrically coupled to each other through a contact 246.

FIG. 21(d) shows a layout pattern up to the third metal interconnection layer of power feed cell PMCP.

As shown in FIG. 21(d), in the third layer, a shared metal 263 is provided which is electrically coupled to metal 253 and metal 243 through contacts 268 and 262, respectively. Furthermore, a metal 265 is provided which is electrically couple to metal 255 through a contact 264. It is noted that metal 245 is provided as a dummy metal as described above and is not electrically coupled to metal 245 and metal 265 through a contact.

This metal 263 forms a power supply line supplying P well voltage VSSB, and metal 265 forms a power supply line supplying N well voltage VDDB.

As for the upper region, in the boundary region between the upper adjacent memory cell MC and the power feed cell which constitute the same column, metal 156 forming the power supply line electrically coupled through contact 155 of memory cell MC as illustrated in FIG. 20(d) is disposed to extend along the X direction.

On the other hand, as for the lower region, in the boundary region between the lower adjacent memory cell MC and the power feed cell which constitute the same column on the lower side, metal 257 is electrically coupled to a metal 267 through a contact 266. This metal 267 is formed as a power supply line supplying voltage ARVSS provided for the lower adjacent memory cell MC.

In other words, in this configuration, as for N well voltage VDDB, the well voltage is supplied through a path of metal 265—contact 264—metal 255—contact 254—metal 235—contacts 216, 219, 210—dummy active region 204. On the other hand, as for P well voltage VSSB, the well voltage is supplied through a path of metal 263—contacts 262, 268—metals 253, 243—contacts 252, 242—metals 236, 231—contacts 209, 211—dummy active regions 207, 208.

FIG. 22 is a structural view in cross section along II-II of power feed cell PMCP.

Referring to FIG. 22, metal 263 supplying P well voltage VSSB is provided in the third layer. Metals 135, 140 forming bit lines BL, /BL and metal 137 supplying voltage ARVDD are provided in the second layer as described above. Metal 235 electrically coupled to N well voltage VDDB is provided in the first layer and is electrically coupled to active region 204 subjected to N+ ion implantation in the N well region through contact 210.

Metal 236 electrically coupled to P well voltage VSSB is electrically coupled to active region 207 subjected to P+ ion implantation in the P well region through contact 209. Metal 231 electrically coupled to P well voltage VSSB is electrically coupled to active region 208 subjected to P+ ion implantation in the P well region through contact 211.

The configuration in power feed cell PMCP allows N well voltage VDDB to be supplied to the N well region through dummy active region 204 and allows P well voltage VSSB to be supplied to the P well regions through dummy active regions 207 and 208.

Accordingly, well feed can be performed on the basis of a plurality of cells so that the layout area of each memory cell MC is reduced thereby reducing the layout area of the memory array as a whole.

On the other hand, the conventional power feed cell has the following problems in its layout.

FIG. 23 is a layout diagram in a case where a power supply line is disposed for the conventional power feed cell.

Here, a part of the metals illustrated in FIGS. 21(c) and (d) is shown.

In the memory array, four interconnection tracks are provided along the Y direction. Specifically, interconnection tracks 2M0-2M3 provided here in the second metal interconnection layer are shown along the Y direction. Three of them are used as bit lines BL, /BL and a power supply line supplying voltage ARVDD. Here, 3M0, 3M1 represent interconnection tracks provided in the third metal interconnection layer to form power supply lines supplying P well voltages VSSB and VDDB.

Therefore, in order to provide interconnection along the Y direction so as not to interfere with these bit lines BL, /BL and the power supply line for voltage ARVDD, the region corresponding to the remaining one interconnection track is used to interconnect metals for establishing contact between the power supply lines (N well voltages VDDB, VSSB) provided in the third metal interconnection layer along the X direction and the active region in the underlying region. In other words, a piling region from the third metal interconnection layer to the underlayer has to be secured. The piling region refers to an interconnection space required to establish contact with an underlying metal interconnection layer. Here, by way of example, the aforementioned metals 253, 255 each of 0.1 µm in the X direction and 0.5 µm in the Y direction are aligned in the Y direction.

This piling region needs to be provided for each of the power supply line supplying N well voltage VDDB and the power supply line supplying P well voltage VSSB, so that some area needs to be secured to some extent. Therefore, the area of power feed cell PMCP cannot be reduced in order to secure these two piling regions. In other words, the layout area of the power feed cell is inevitably increased by the lengths of the metals in the Y direction to be used for interconnection from two power supply lines formed in the same metal interconnection layer to the underlayer.

SUMMARY OF THE INVENTION

The present invention is made to solve the problems as described above. An object of the present invention is to provide a semiconductor memory device in which the layout area of the entire memory array can be further reduced by reducing the layout area of a power feed cell.

A semiconductor memory device in accordance with the present invention includes a memory array having a plurality of memory cells arranged in a matrix of rows and columns, each including a pair of load transistors of a second conductivity type formed in a first well region of a first conductivity type and a pair of diver transistors of the first conductivity type connected to the load transistors to form a flip-flop, and a plurality of power feed cells, each provided corresponding to a memory cell column, which constitute a row provided to feed the first and second well regions. The first and second well regions are alternately disposed in a row direction to extend in a column direction. The semiconductor memory device further includes: a first power supply line provided corresponding to the plurality of power feed cells along the row direction and electrically coupled to the power feed cell to supply a first power supply voltage to the first well region; and a second power supply line provided corresponding to the plurality of power feed cells along the row direction and electrically coupled to the power feed cell to supply a second power supply voltage to the second well region. The first power supply line is electrically coupled to the first well region through a contact provided for a first metal interconnection layer, and the second power supply line is formed in an upper layer above the first metal interconnection layer and is electrically coupled to the second well region through a plurality of contacts provided for each metal interconnection layer.

The semiconductor memory device in accordance with the present invention includes a power feed cell feeding first and second well regions by first and second power supply lines, respectively. The first power supply line is electrically coupled to the first well region through a contact provided in a first metal interconnection layer, and the second power supply line is formed in an upper layer above the first metal interconnection layer and is electrically coupled to the second well region through a plurality of contacts provided for each metal interconnection layer. In other words, the first power supply line is electrically coupled to the first well region through one contact and thus does not require a piling region electrically coupling through an interconnection layer, so that a layout margin for securing such a region can be reduced thereby reducing the layout area of a power feed cell and reducing the area of the memory array as a whole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
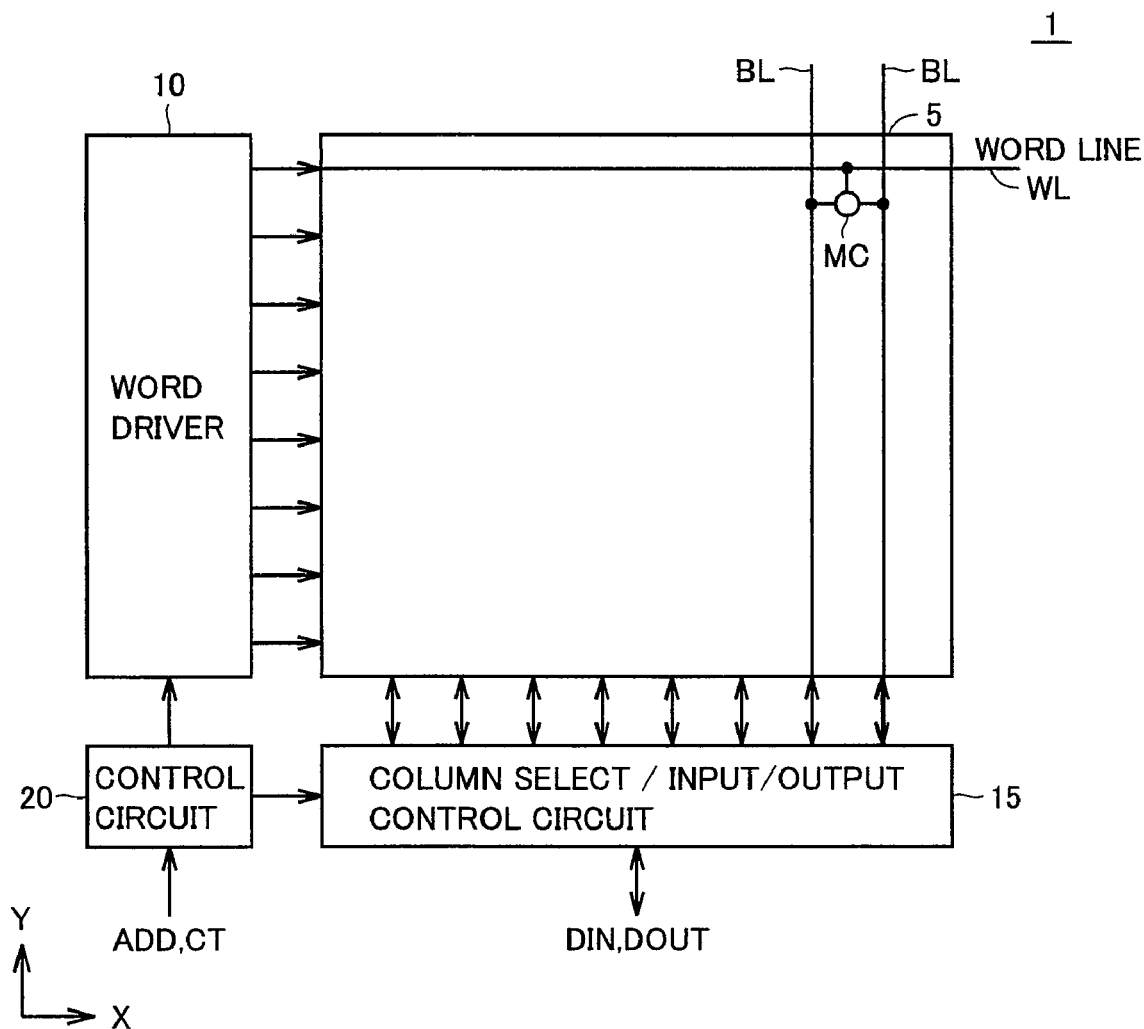
FIG. 1 is a schematic block diagram of a semiconductor memory device in accordance with an embodiment of the present invention.

In the following, embodiments of the present invention will be described in detail with reference to the figures. It is noted that in the figures the same or corresponding parts will be denoted with the same reference characters and a description thereof will not be repeated.

First Embodiment

Referring to FIG. 1, a semiconductor memory device 1 in accordance with a first embodiment of the present invention includes a control circuit 20, a memory array 5, a word driver 10, and a column select circuit/input/output control circuit 15. Control circuit 20 controls the entire semiconductor memory device 1 based on inputs of address ADD and a control signal CT and executes a necessary instruction or control for word driver 10 and column select circuit/input/output control circuit 15. Memory array 5 has memory cells MC integrated and arranged in a matrix and includes a word line WL provided corresponding to each of memory cell rows along the row direction (X direction) and bit lines BL, /BL provided corresponding to each of memory cell columns along the column direction (Y direction).

Word driver 10 drives word line WL to execute access to a selected memory cell row. Column select circuit/input/output control circuit 15 executes column selection of the memory array in response to an instruction from control circuit 20 and executes a column select operation for bit lines BL, /BL, for example, in data writing, drives bit lines BL, /BL to a prescribed logic level based on input data DIN for data write. In data reading, output data DOUT is generated and output which is held by memory cell MC selected based on read current flowing in the selected memory cell MC through bit lines BL, /BL.

Figure 16:
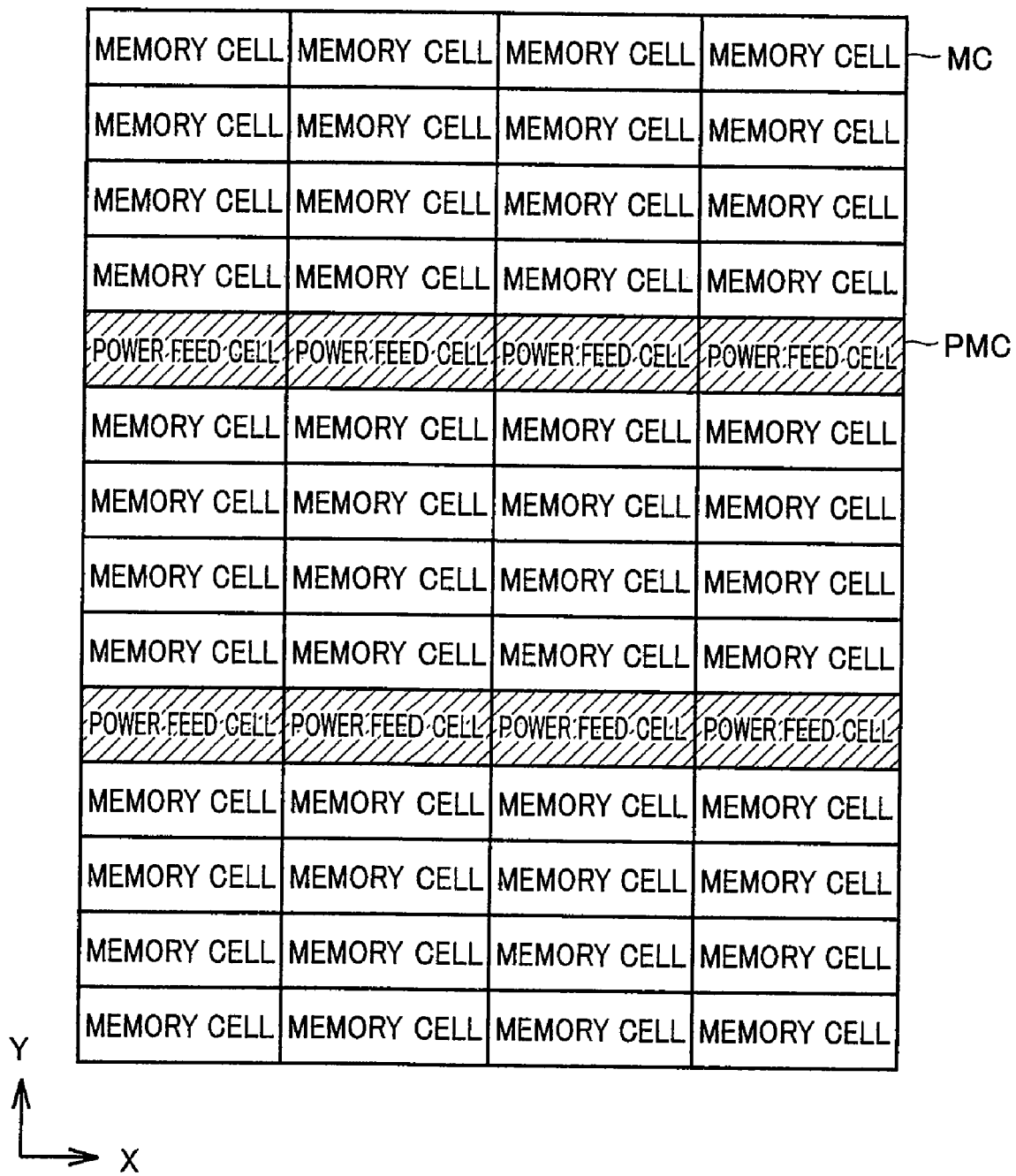
FIG. 16 is a schematic diagram of a general memory array.
Figure 17:
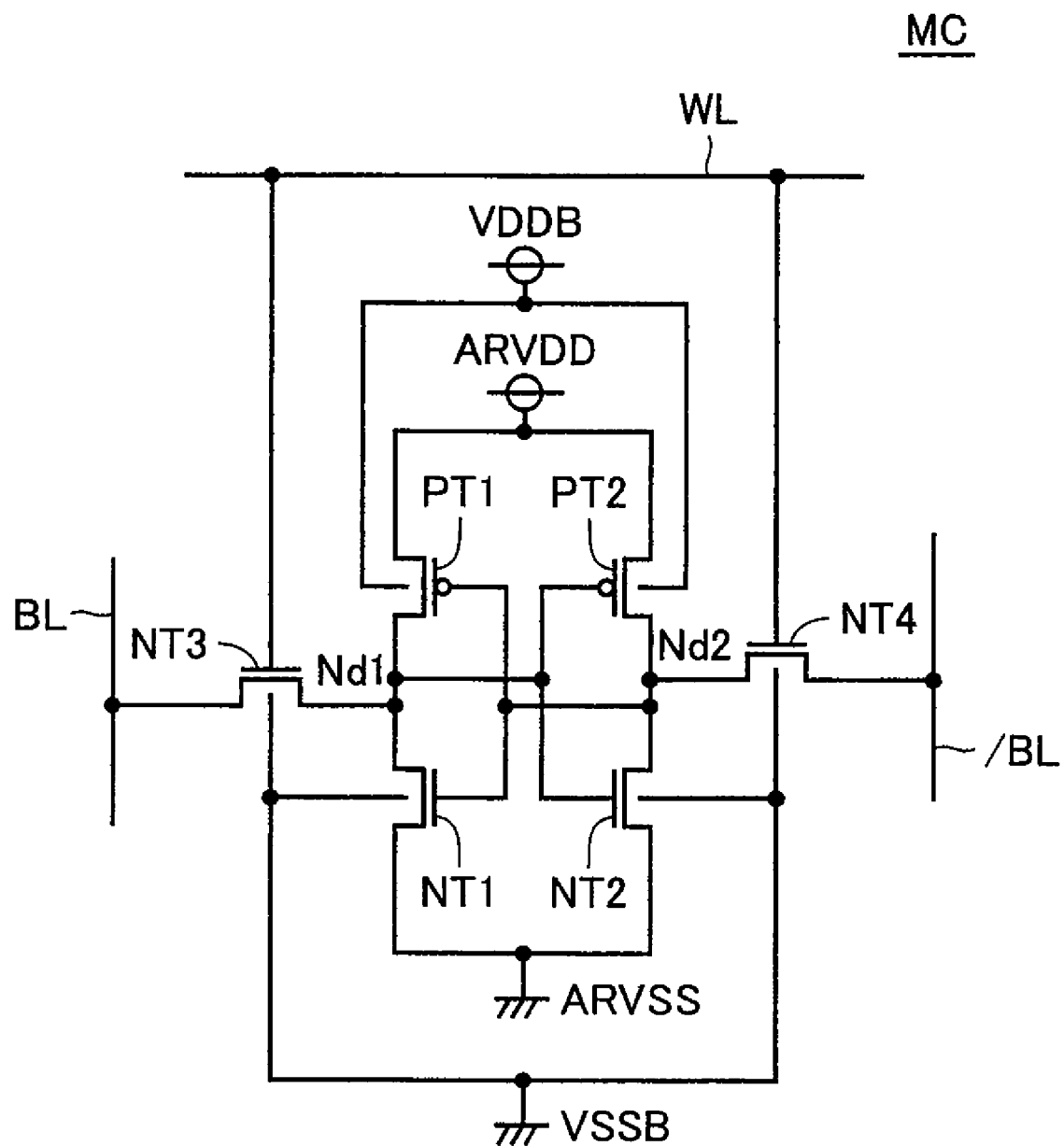
FIG. 17 is a circuit configuration diagram of a memory cell.
Figure 18:
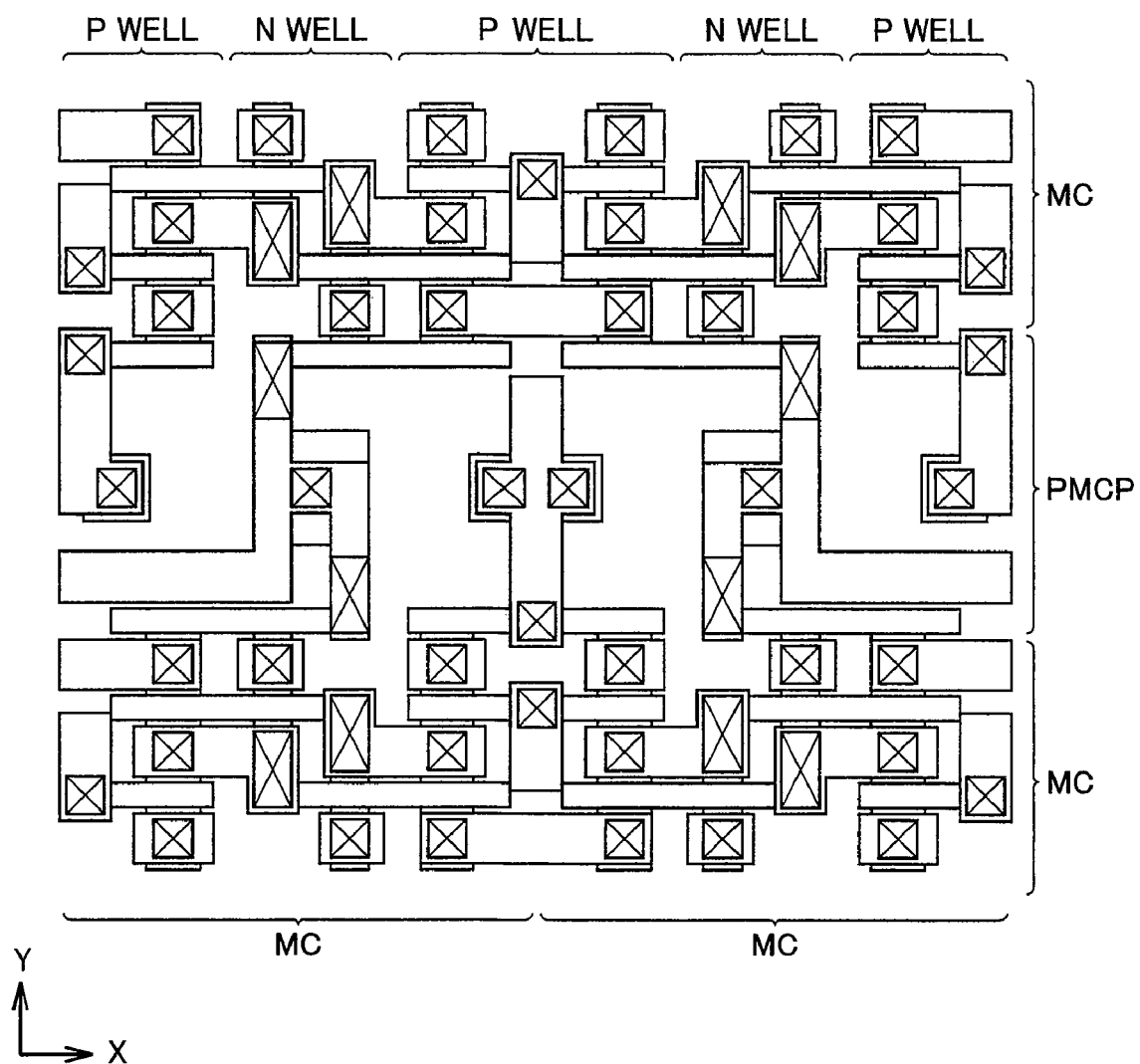
FIG. 18 illustrates a layout pattern of memory cells and power feed cells of a conventional memory array.
Figure 19:
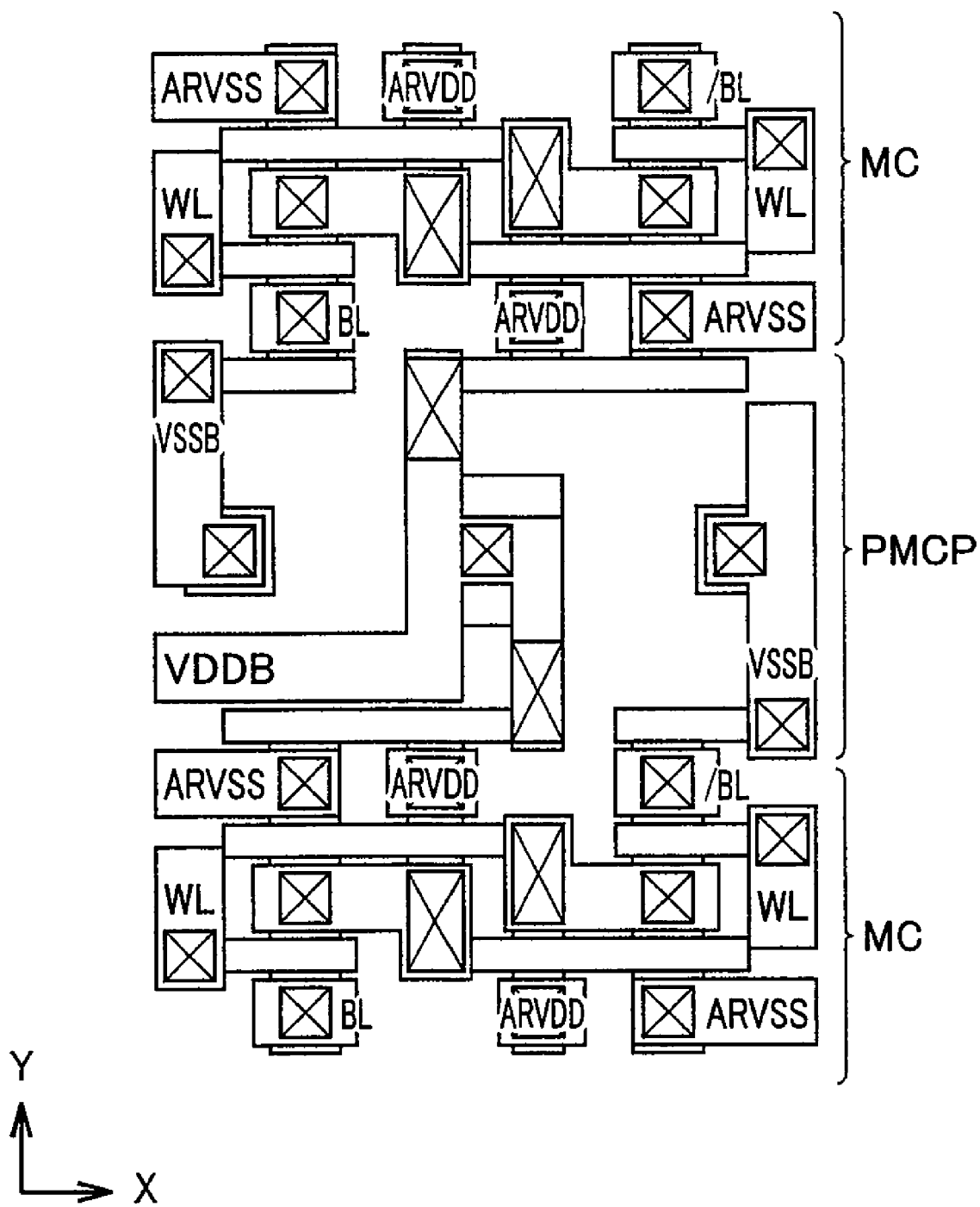
FIG. 19 illustrates a part of the cell layout shown in FIG. 18.

Memory array 5 has memory cells integrated and arranged in a matrix as illustrated in FIG. 16, and a power feed cell row formed of a plurality of power feed cells is provided every prescribed number of memory cell rows to execute well feed. It is noted that the present invention is particularly directed to a power feed cell performing well feed to memory cell MC, of which layout pattern will mainly be described.

Using FIG. 2, a layout pattern of memory cells and power feed cells in accordance with the first embodiment of the present invention will be described.

Figure 2:
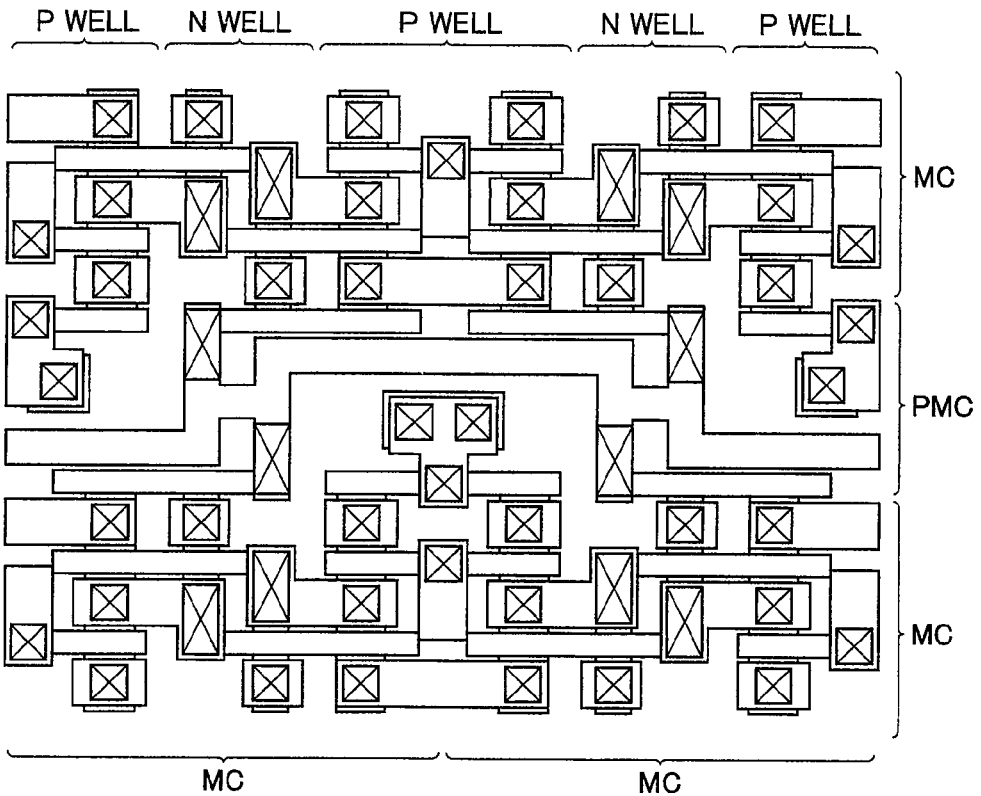
FIG. 2 illustrates a layout pattern of memory cells and power feed cells of a memory array in accordance with a first embodiment of the present invention.

Referring to FIG. 2, here, a power feed cell PMC is provided between two memory cells MC correspondingly to a column, and four memory cells MC and two power feed cells PMC are shown. Furthermore, a P well region and an N well region in which active regions for forming memory cell MC and power feed cell PMC are disposed are alternately disposed in the row direction, namely in the X direction to extend in the column direction, namely in the Y direction.

The layout of memory cells MC and power feed cells PMC which is reflective-symmetric with respect to the boundary region is repeatedly arranged. Memory cells MC and power feed cell PMC each have active regions and interconnection lines disposed in reflective symmetry in the Y direction. Although not shown here, in a memory cell column, active regions and interconnection lines are disposed in reflective symmetry in the X direction between adjacent memory cells MC.

Although memory cell MC and power feed cell PMC are different in interconnection and the like, an active region and an interconnection line are disposed in power feed cell PMC using a similar layout pattern as memory cell MC in order to make the layout pattern uniform. In other words, in the column direction, power feed cell PMC is formed using a dummy layout pattern similar to the layout pattern of memory cell MC to have a reflective-symmetric relation with the adjacent memory cell MC in the X direction.

The use of this layout pattern makes it possible to shape a uniform layout pattern with reduced pattern variations with the continuity of the layout pattern of the cell layout being kept.

Using FIG. 3, a part of the cell layout shown in FIG. 2 will be described.

Figure 3:
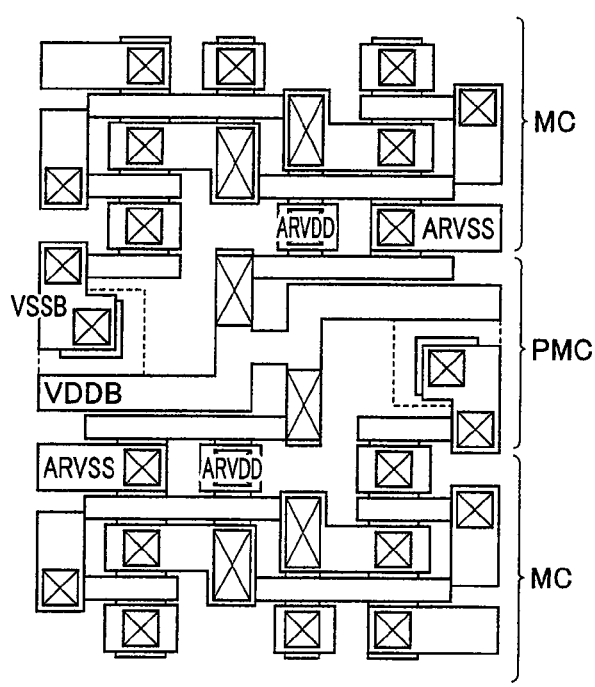
FIG. 3 illustrates a part of the cell layout shown in FIG. 2.
Figure 20:
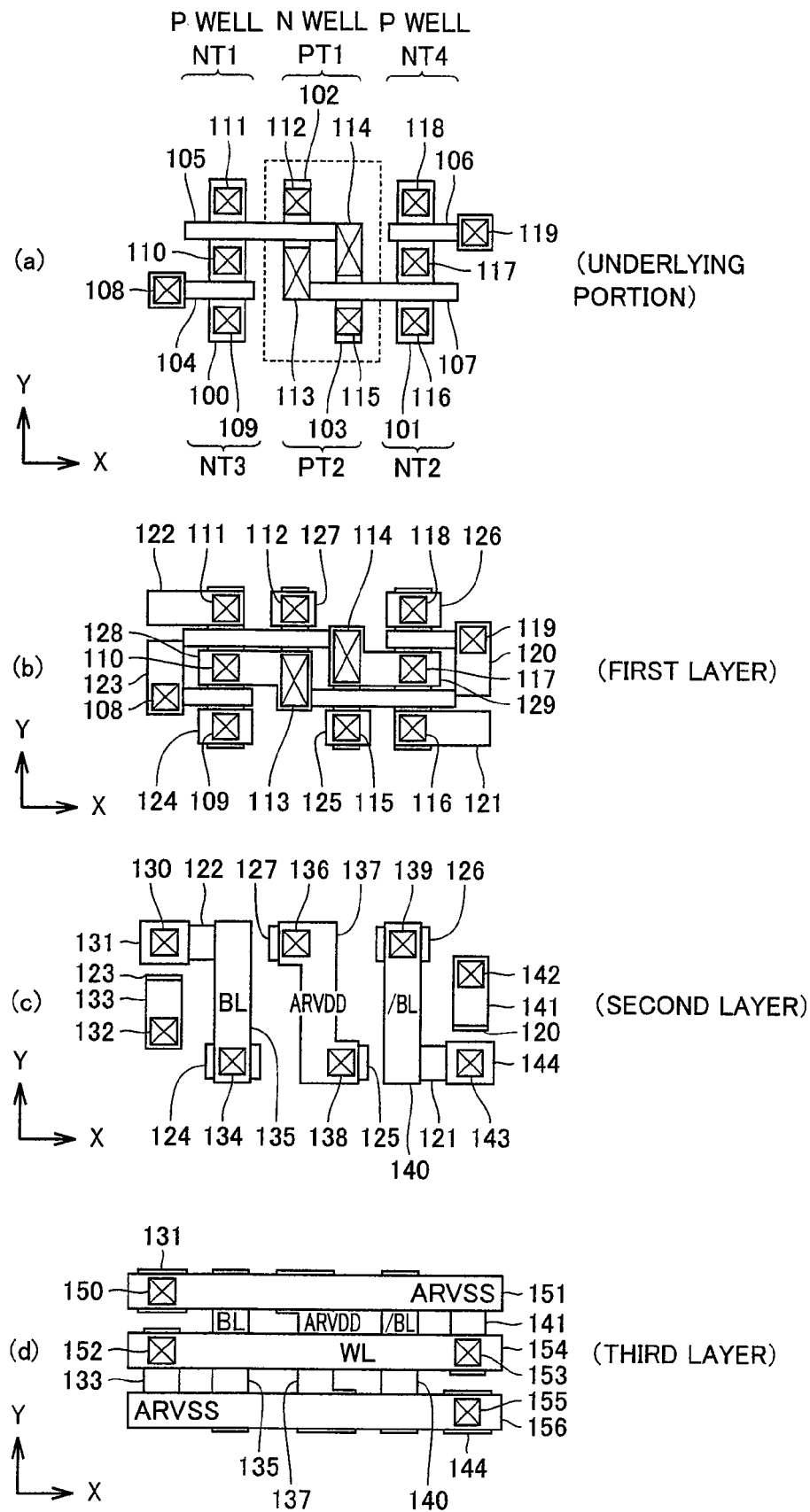
FIG. 20 illustrates a layout pattern of a memory cell.

Referring to FIG. 3, shown here are two memory cells MC and power feed cell PMC provided therebetween in a memory cell column. It is noted that the layout pattern of memory cell MC is similar to that illustrated in FIG. 20. Therefore, detailed description of the same parts will not be repeated and the same parts will be denoted with the same reference characters.

In the following, a layout pattern of power feed cell PMC in accordance with the first embodiment of the present invention veil be described. Here, a power supply line supplying N well voltage VDDB is formed using the first metal interconnection layer, by way of illustration.

Using FIG. 4, a layout pattern of power feed cell PMC in accordance with the first embodiment of the present invention will be described.

FIG. 4(a) shows a layout pattern of an underlying portion of power feed cell PMC.

Here, as described above, an N-type N well region is disposed to linearly extend in the Y direction, and P-type P well regions are disposed on opposite sides of the N well region. These N well region and P well regions are arranged extending in the column direction to be shared with memory cell MC. A power feed cell for executing well feed is formed using transistor formation active regions formed as a dummy layout pattern in these N well region and P well regions.

Specifically, a dummy active region 301 for feeding a well voltage is disposed in the P well region of the power feed cell. A dummy active region 303 for feeding a well voltage is disposed similarly in the other P well region. A dummy active region 300 for feeding a well voltage is disposed in the N well region.

Then, in order to keep the continuity of the layout pattern, a dummy polysilicon interconnection line is disposed. Specifically, dummy polysilicon interconnection lines 222-225 are provided along the X direction in reflective symmetry with the layout pattern of the adjacent memory cell MC. In the upper region, polysilicon interconnection line 225 is disposed along the X direction in an end region of active region 100, and polysilicon interconnection line 224 is disposed to extend along the X direction in end regions of active regions 103 and 101. On the other hand, in the lower region, polysilicon interconnection line 223 is disposed to extend along the X direction in an end region of active region 201, and polysilicon interconnection line 222 is disposed to extend along the X direction in end regions of active regions 200, 203.

Then, contacts electrically coupled to polysilicon interconnection lines 222-225 are disposed in order to keep the continuity of the layout pattern.

Specifically, shared contact 219 is disposed to establish a shared contact with polysilicon interconnection line 222 and active region 300. Furthermore, contact 217 is disposed for polysilicon interconnection line 223. In addition, shared contact 216 is disposed to establish a shared contact with polysilicon interconnection line 224 and active region 300. In addition, contact 213 is disposed for polysilicon interconnection line 225.

Then, a contact 302 for establishing contact with a power supply line supplying P well voltage VSSB to be fed to the P well is disposed in dummy active region 301. Furthermore, a contact 304 for establishing contact with a power supply line supplying P well voltage VSSB to be fed to the P well is disposed in dummy active region 303.

Here, the region surrounded with the dotted line as shown is a region in which P-type ion implantation is performed on active regions 301, 303 in the P well regions. Here, the region not surrounded with a dotted line is subjected to N-type ion implantation.

Figure 21:
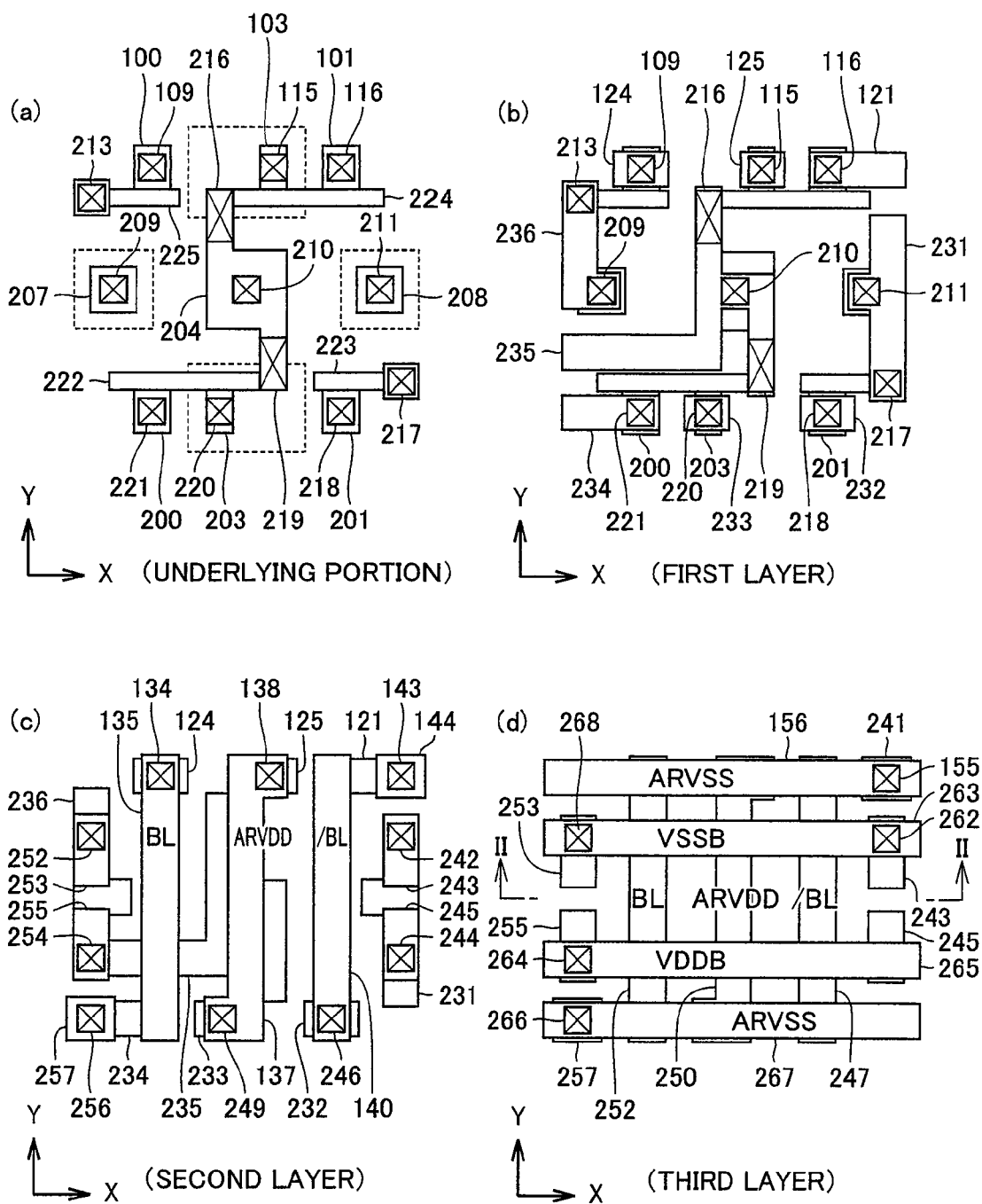
FIG. 21 illustrates a layout pattern of a conventional power feed cell.
Figure 22:
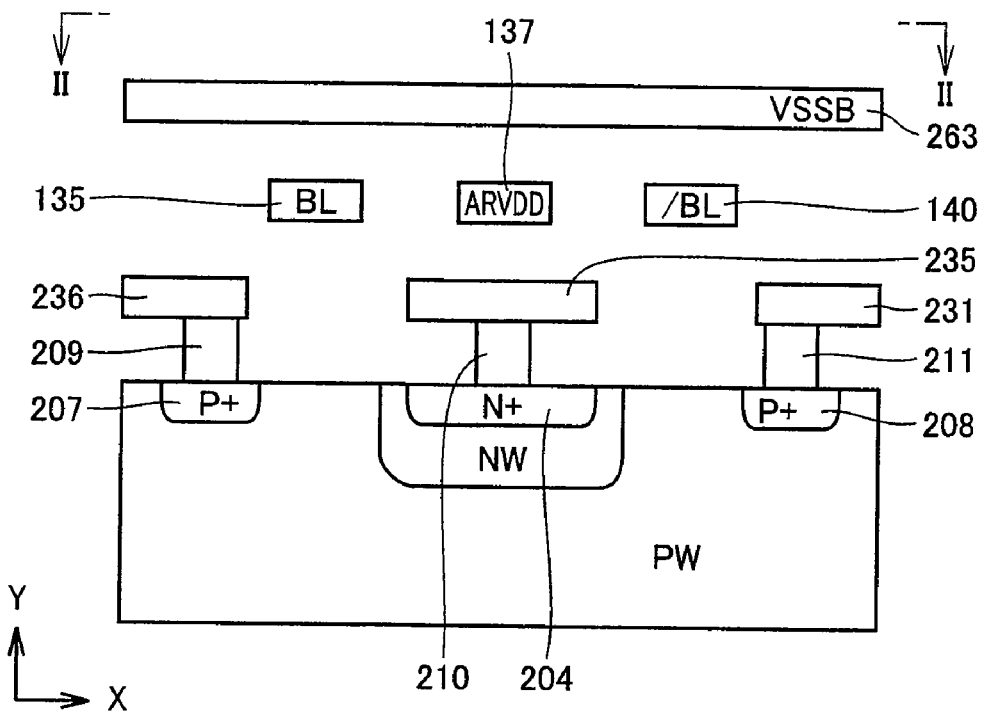
FIG. 22 is a structural view in cross section along II-II of the power feed cell in FIG. 21.

As compared with the layout pattern illustrated in FIG. 21, there are differences in that dummy active regions 207, 208 formed in the P well regions are replaced by dummy active regions 301, 303 and in that dummy active region 204 is replaced by dummy active region 300. The other configuration is similar to that illustrated in FIG. 21.

The layout pattern of dummy active regions 301, 303 is such that they are shifted to come closer to the boundary region between power feed cell PMC and memory cell MC, symmetrically along the Y direction. Specifically, dummy active region 301 and polysilicon interconnection line 225 are laid out to come closer to each other with a prescribed spacing. Furthermore, dummy active region 303 and polysilicon interconnection line 223 are laid out to come closer to each other with a prescribed spacing.

Then, the length in the Y direction of dummy active region 300 is reduced and the distance between shared contacts 216 and 219 is reduced, so that the length in the Y direction of the underlying region of the power feed cell is reduced. Here, no contact is provided in dummy active region 300.

FIG. 4(b) shows a layout pattern up to the first metal interconnection layer of power feed cell PMC.

As shown in FIG. 4(b), in the first layer, a metal 310 is provided which is electrically connected to contact 213 and contact 302. Furthermore, a metal 312 is provided which is electrically connected to shared contacts 216 and 219. In addition, a metal 311 is provided which is electrically connected to contact 304 and contact 217. This metal 312 is used as a power supply line supplying N well voltage VDDB. This metal 312 has a portion linearly extending in the X direction and Y direction in power feed cell PMC and is formed in a shape point-symmetric with respect to the central portion and formed continuously extending to be electrically coupled to respective shared contacts 216 and 219 in adjacent power feed cells PMC in the same row as shown in FIG. 2.

In the upper region, in the boundary region between the upper adjacent memory cell MC and the power feed cell which constitute the same column, the metals having the aforementioned active regions 100, 101, 103 of memory cell MC in the column direction connected through contacts are denoted by the same reference characters and are similar to those illustrated in FIG. 20(b), and thus a detailed description thereof will not be repeated.

Similarly, in the lower region, in the boundary region between the lower adjacent memory cell MC and the power feed cell which constitute the same column on the lower side, active regions 200, 201, 203 for forming the lower adjacent memory cell MC are shown and are similar to those illustrated in FIG. 21(b), and thus a detailed description thereof will not be repeated.

FIG. 4(c) shows a layout pattern up to the second metal interconnection layer of power feed cell PMC.

As shown in FIG. 4(c), in the second layer, a metal 323 is provided which is electrically coupled to metal 310 through a contact 322. In addition, a metal 321 is provided which is electrically coupled to metal 311 through a contact 320.

As for the upper region, in the boundary region between the upper adjacent memory cell MC and the power feed cell which constitute the same column, metal 135 forming bit line BL electrically coupled through contact 134 of memory cell MC as illustrated in FIG. 20(c) is disposed to extend along the Y direction. Furthermore, metal 137 forming a power supply line supplying voltage ARVDD electrically coupled through contact 138 of memory cell MC is disposed to extend along the Y direction. Similarly, metal 140 forming bit line /BL of memory cell MC is disposed to extend along the Y direction.

Similarly, in the lower region, in the boundary region between the lower adjacent memory cell MC and the power feed cell which constitute the same column on the lower side, metal 234 and metal 257 are electrically coupled to each other through contact 256 illustrated in FIG. 21(c). Furthermore, metal 233 and metal 137 are electrically coupled to each other through contact 249. In addition, metal 232 and metal 140 are electrically coupled to each other through contact 246.

FIG. 4(d) shows a layout pattern up to the third metal interconnection layer of power feed cell PMC.

As shown in FIG. 4(d), in the third layer, metals 332 and 333 are provided which are electrically coupled to metal 323 through contacts 334 and 335, respectively. Furthermore, metals 332 and 333 are provided which are electrically coupled to metal 321 through contacts 330 and 331, respectively. These metals 332 and 333 form power supply lines supplying P well voltage VSSB.

As for the upper region, in the boundary region between the upper adjacent memory cell MC and the power feed cell which constitute the same column, metal 156 forming a power supply line supplying voltage ARVSS electrically coupled through contact 155 of memory cell MC illustrated in FIG. 20(d) is disposed to extend along the X direction.

On the other hand, as for the lower region, in the boundary region between the lower adjacent memory cell MC and the power feed cell which constitute the same column on the lower side, metal 257 is electrically coupled to metal 267 through contact 266. This metal 267 is disposed to extend along the X direction as a power supply line supplying voltage ARVSS provided for the lower adjacent memory cell MC.

In summary, in this configuration, as for N well voltage VDDB, the well voltage is supplied though a path of metal 312—contacts 216, 219—dummy active region 300. On the other hand, as for P well voltage VSSB, the well voltage is supplied through a path of metals 332, 333—contacts 330, 331, 334, 335—metals 321, 323—contacts 320, 322—metals 311, 310—contacts 304, 302—dummy active regions 303, 301.

Figure 5:
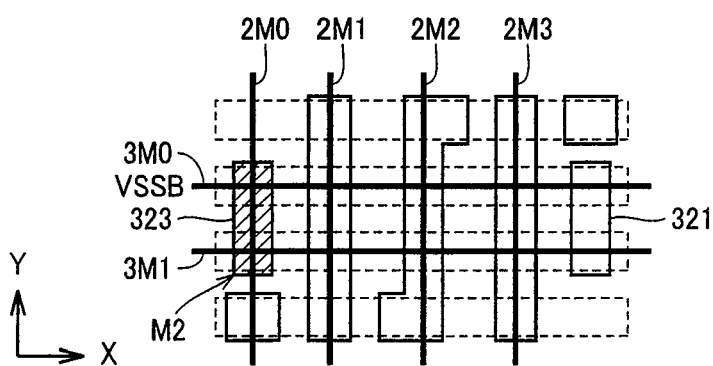
FIG. 5 is a layout diagram in a case where a power supply line is disposed for the power feed cell in accordance with the first embodiment of the present invention.

Using FIG. 5, a layout will be described in a case where a power supply line is disposed for the power feed cell in accordance with the first embodiment of the present invention.

Here, a part of the metals illustrated in FIGS. 4(c) and (d) is shown.

As described above, in the memory cell array, four interconnection tracks are provided in the second metal interconnection layer. Specifically, here, 2M0-2M3 are shown along the Y direction. Three of them are used as bit lines BL, /BL and a power supply line supplying voltage ARVDD.

Therefore, in order to provide interconnection of the remaining two N well voltages VDDB and VSSB so as not interfere with these bit lines BL, /BL and the power supply line for voltage ARVDD, a piling region to the underlayer needs to be secured using the region corresponding to the remaining one interconnection track. In the configuration of the first embodiment, the power supply line supplying N well voltage VDDB is formed using a metal in the first metal interconnection layer different form the third metal interconnection layer and does not require a piling region to the underlayer, and it is only necessary to secure a piling region of the power supply line for P well voltage VSSB.

Accordingly, in the conventional power feed cell, as described above, the length in the Y direction cannot be reduced in order to secure two different piling regions along the Y direction. However, the configuration of the present invention only needs an area for one piling region so that the length in the Y direction of power feed cell PMC can be reduced thereby reducing the layout area of a power feed cell. In other words, the layout area of the memory array can be further reduced as a whole by reducing the layout area of a power feed cell.

Figure 23:
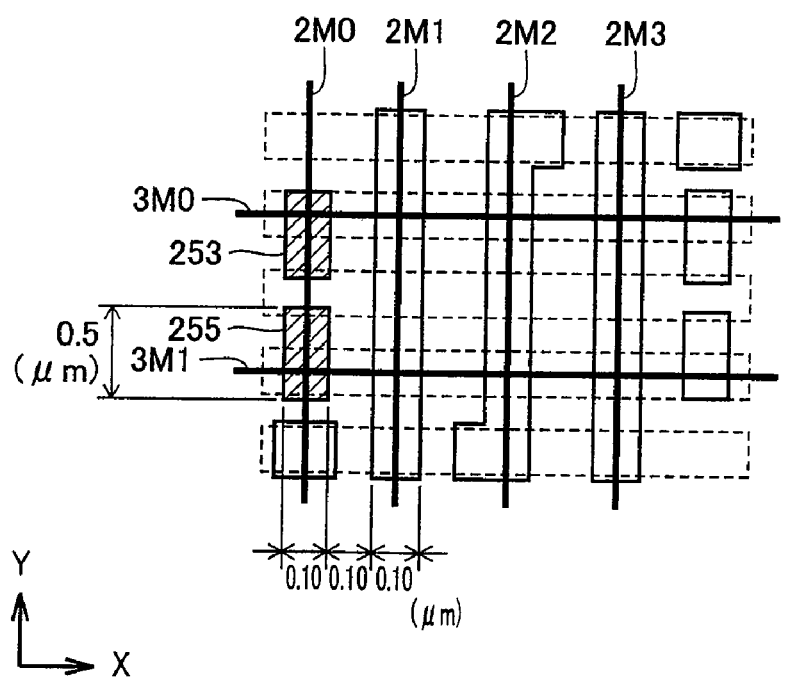
FIG. 23 is a layout diagram in a case where a power supply line is disposed for the conventional power feed cell.

In the configuration in FIG. 23, for the conventional power feed cell PMCP, a layout margin needs to be secured to such an extent that three interconnection tracks each provided along the X direction can be arranged along the Y direction. However, in the case of power feed cell PMC in accordance with the first embodiment of the present invention, the layout margin is reduced to such an extent that two interconnection tracks each provided along the X direction can be arranged along the Y direction, as shown in FIG. 5.

Here, in this example, two power supply lines supplying P well voltage VSSB are arranged in interconnection tracks 3M0, 3M1 in the third metal interconnection layer, for the purpose of enhancing P well voltage VSSB, by way of example. However, in particular, the number of the power supply lines supplying P well voltage VSSB may not be two, and interconnection may be configured with one interconnection line, as a matter of course. Furthermore, in this example, metal 312 and dummy active region 300 are electrically coupled to each other through only shared contacts 216, 219. However, a contact electrically coupled to metal 312 may be provided in dummy active region 300.

Second Embodiment

Using FIG. 6, a layout pattern of memory cells and power feed cells of a memory array in accordance with a second embodiment of the present invention will be described.

Figure 6:
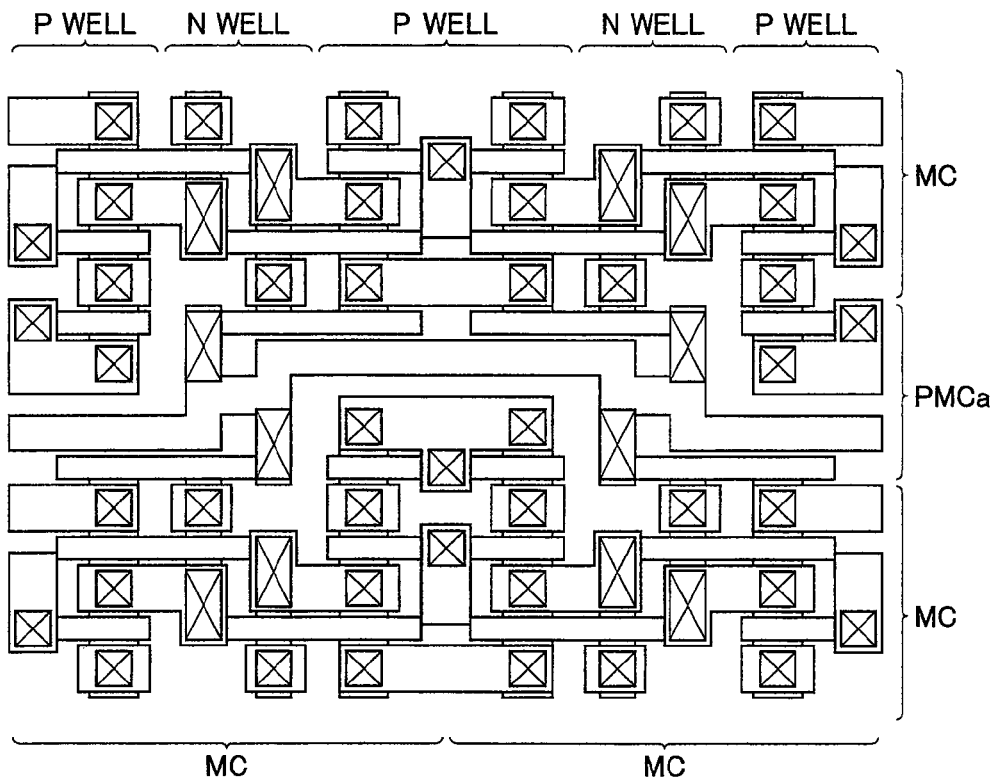
FIG. 6 illustrates a layout pattern of memory cells and power feed cells of a memory array in accordance with a second embodiment of the present invention.

Referring to FIG. 6, here, a power feed cell PMCa is provided between two memory cells MC correspondingly to a column, and four memory cells MC and two power feed cells PMCa are shown. Furthermore, a P well region and an N well region in which active regions for forming memory cell MC and power feed cell PMCa are disposed are alternately disposed in the row direction, namely in the X direction to extend in the column direction, namely in the Y direction.

The layout of memory cell MC and power feed cell PMCa which is reflective-symmetric with respect to the boundary region is repeatedly arranged. Memory cell MC and power feed cell PMCa have active regions and interconnection lines disposed in reflective symmetry in the Y direction. Although not shown here, in a memory cell column, active regions and interconnection lines are disposed in reflective symmetry in the X direction between adjacent memory cells MC.

Using FIG. 7, a part of the cell layout shown in FIG. 6 will be described.

Figure 7:
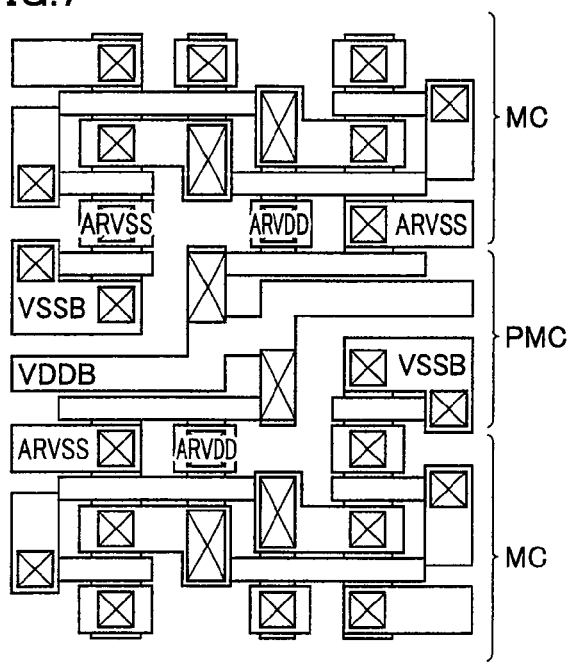
FIG. 7 illustrates a part of the cell layout shown in FIG. 6.

Referring to FIG. 7, shown here are two memory cells MC and power feed cell PMCa provided therebetween in a memory cell column. Here, the layout pattern of memory cell MC is similar to that illustrated in FIG. 20. Therefore, a detailed description of the same parts will not be repeated and the same parts will be denoted with the same reference characters.

In the following, the layout pattern of power feed cell PMCa in accordance with the second embodiment of the present invention will be described. Here, the position of a contact in an active region receiving P well voltage VSSB is shifted further.

Using FIG. 8, a layout pattern of power feed cell PMCa in accordance with the second embodiment of the present invention will be described.

FIG. 8(a) shows a layout pattern of an underlying portion of power feed cell PMCa.

Here, as described above, an N-type N well region is disposed to linearly extend in the Y direction, and P-type P well regions are disposed on opposite sides of the N well region. These N well region and P well regions are arranged extending in the column direction to be shared with memory cell MC, and a power feed cell for executing well feed is formed using transistor formation active regions formed as a dummy layout pattern in these N well region and P well regions.

Then, in the P well region of power feed cell PMCa in accordance with the second embodiment of the present invention, the active regions used in the memory cells MC adjacent to the upper region and the lower region are disposed to extend further. Specifically, in place of active regions 100, 201, active regions 100# and 201# are disposed to extend to the P well regions of power feed cell PMCa. Here, shown are active region 100# bent such that an L-shaped active region is reflective-symmetric along the Y direction and active region 200# bent such that an L-shaped active region is reflective-symmetric along the X direction. Active regions 100# and 201# are isolated by dummy polysilicon interconnection lines 225, 223, respectively.

Then, in an active region (isolation active region) of active region 100# facing the power feed cell, which is isolated by dummy polysilicon interconnection line 225, a contact 401 is disposed for establishing contact with a power supply line supplying P well voltage VSSB to be fed to the P well. On the other hand, in an active region (isolation active region) of active region 201# facing the power feed cell, which is isolated by dummy polysilicon interconnection line 223, a contact 404 is disposed for establishing contact with a power supply line supplying P well voltage VSSB to be fed to the P well.

Here, the region surrounded with the dotted line as shown is a region in which P-type ion implantation is performed on a part of active regions 100# and 201# in the P well regions. The region not surrounded with a dotted line is subjected to N-type ion implantation.

Figure 4:
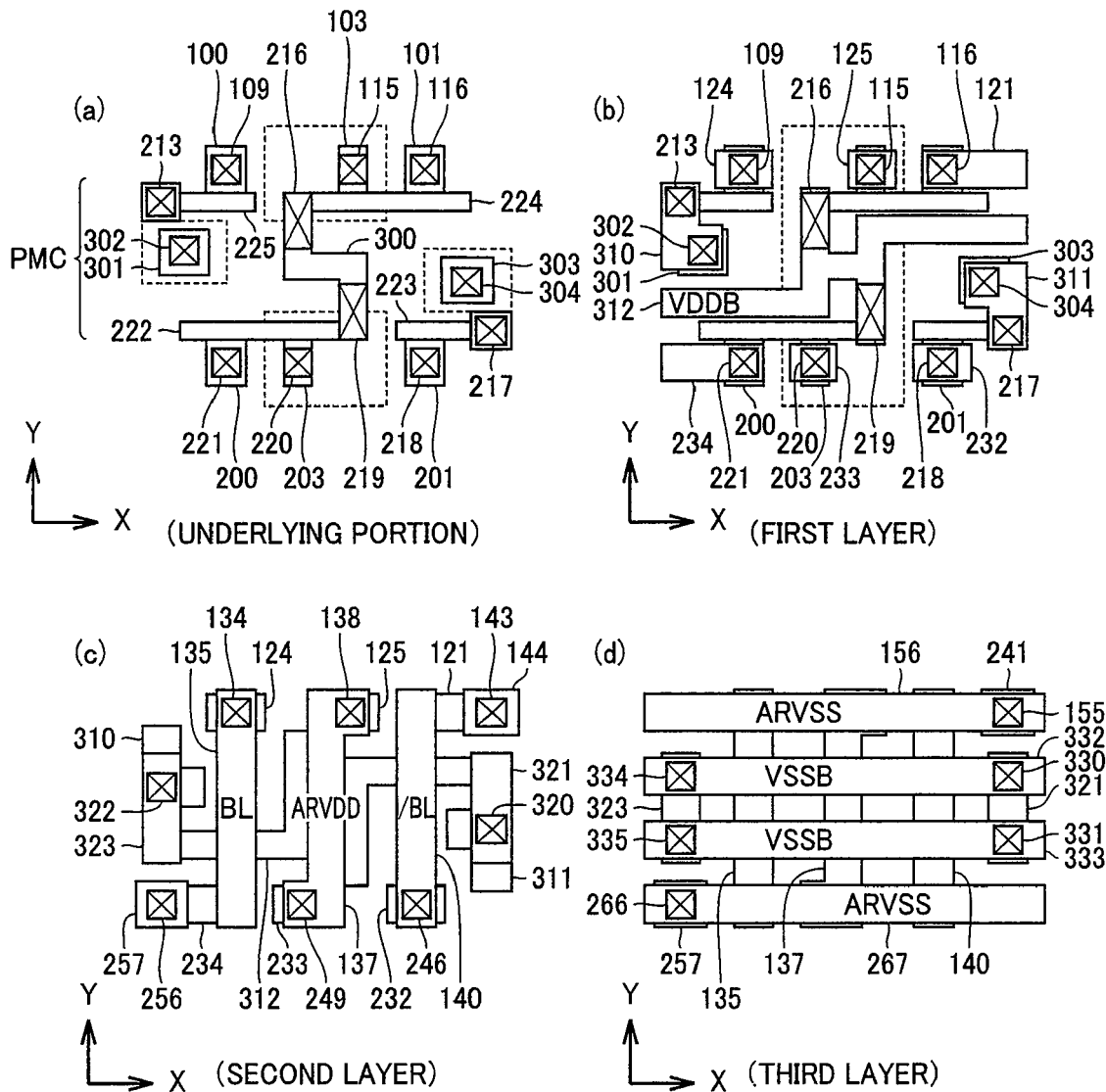
FIG. 4 illustrates a layout pattern of the power feed cell in accordance with the first embodiment of the present invention.

As compared with the layout pattern as illustrated in FIG. 4, there are differences in that active regions 301, 303 formed in the P well regions are deleted and replaced by active regions 100#, 201# and in that active region 300 is replaced by dummy active region 402. The other configuration is similar to that illustrated in FIG. 4.

As described above, active regions 100#, 201# are disposed in such a manner that the active regions used in the memory cells MC adjacent to the upper region and the lower region in the same column extend further. Contact 401 is disposed in a position symmetric to contact 109 along polysilicon interconnection line 225. Contact 404 is disposed in a position symmetric to contact 218 along polysilicon interconnection line 223.

In the configuration in FIG. 4, dummy active regions 301, 303 are independent from polysilicon interconnection lines 225, 223 and active regions 100, 201, respectively, and need to be disposed with a prescribed spacing in order to secure a layout margin. However, in the present configuration, the active regions used in the memory cells MC adjacent to the upper region and the lower region are shared, and the gate-isolated active region is used to dispose a contact with a power supply line supplying P well voltage VSSB to be fed to the P well facing the power feed cell.

Then, as compared with dummy active region 300, the length in the Y direction of dummy active region 402 is reduced and the distance between shared contacts 216 and 219 is reduced, so that the length in the Y direction in the underlying region of the power feed cell is reduced.

FIG. 8(b) shows a layout pattern up to the first metal interconnection layer of power feed cell PMCa.

As shown in FIG. 8(b), in the first layer, a metal 416 is provided which is electrically connected to contact 213 and contact 401. Furthermore, a metal 415 is provided which is electrically connected to shared contacts 216 and 219. In addition, a metal 417 is provided which is electrically connected to contact 404 and contact 217. This metal 415 is used as a power supply line supplying N well voltage VDDB. This metal 415 has a part linearly extending in the X direction and the Y direction in power feed cell PMCa and is formed in a shape point-symmetric with respect to the central portion and formed continuously extending to be electrically coupled to respective shared contacts 216 and 219 in the adjacent power feed cells PMCa in the same row as shown in FIG. 6.

As described above, in the upper region, in the boundary region between the upper adjacent memory cell MC and the power feed cell which constitute the same column, the metals connected through contacts of memory cell MC in the column direction are denoted by the same reference characters and are similar to those illustrated in FIG. 20(b), and thus a detailed description thereof will not be repeated.

Similarly, in the lower region, in the boundary region between the lower adjacent memory cell MC and the power feed cell which constitute the same column on the lower side, the metals connected through contacts of the lower adjacent memory cell MC are denoted by the same reference characters and are similar to those illustrated in FIG. 21(b), and thus a detailed description thereof will not be repeated.

FIG. 8(c) shows a layout pattern up to the second metal interconnection layer of power feed cell PMCa.

As shown in FIG. 8(c), in the second layer, a metal 421 is provided which is electrically coupled to metal 416 through a contact 420. Furthermore, a metal 423 is provided which is electrically coupled to metal 417 through a contact 422.

As for the upper region, in the boundary region between the upper adjacent memory cell MC and the power feed cell which constitute the same column, metal 135 which forms bit line BL electrically coupled through contact 134 of memory cell MC illustrated in FIG. 20(c) is disposed to extend along the Y direction. Furthermore, metal 137 which forms a power supply line supplying voltage ARVDD electrically coupled through contact 138 of memory cell MC is disposed to extend along the Y direction. Similarly, metal 140 which forms bit line /BL of memory cell MC is disposed to extend along the Y direction.

Similarly, in the lower region, in the boundary region between the lower adjacent memory cell MC and the power feed cell which constitute the same column on the lower side, metal 234 and metal 257 are electrically coupled to each other through contact 256 illustrated in FIG. 21(c). Furthermore, metal 233 and metal 137 are electrically coupled to each other through contact 249. In addition, metal 232 and metal 140 are electrically coupled to each other through contact 246.

FIG. 8(d) shows a layout pattern up to the third metal interconnection layer of power feed cell PMCa.

As shown in FIG. 8(d), in the third layer, a shared metal 431 is provided which is electrically coupled to metals 421 and 423 through contacts 430 and 432, respectively. This metal 431 forms a power supply line supplying P well voltage VSSB.

As for the upper region, in the boundary region between the upper adjacent memory cell MC and the power feed cell which constitute the same column, metal 156 which forms a power supply line supplying voltage ARVSS electrically coupled through contact 155 of memory cell MC illustrated in FIG. 20(d) is disposed to extend along the X direction.

On the other hand, as for the lower region, in the boundary region between the lower adjacent memory cell MC and the power feed cell which constitute the same column on the lower side, metal 257 is electrically coupled to metal 267 through contact 266. This metal 267 is disposed to extend along the X direction as a power supply line supplying voltage ARVSS provided for the lower adjacent memory cell MC.

In short, in this configuration, as for N well voltage VDDB, the well voltage is supplied through a path of metal 415—contacts 216, 219—dummy active region 402. On the other hand, as for P well voltage VSSB, the well voltage is supplied through a path of metal 431—contacts 432, 430—metals 423, 421—contacts 422, 420—metals 417, 416—contacts 404, 401—the gate-isolated active regions 201 #, 100# (isolation active region).

In this configuration, similarly to that illustrated in the first embodiment, the power supply line supplying N well voltage VDDB is formed using a metal in the first metal interconnection layer different from the third metal interconnection layer and thus does not require a piling region to the underlayer, and it is only necessary to secure a piling region for a power supply line for P well voltage VSSB.

Accordingly, although in the conventional power feed cell, the length in the Y direction cannot be reduced in order to secure two different piling regions along the Y direction as described above, the present configuration only requires an area for one piling region, so that the length in the Y direction of power feed cell PMC can be reduced thereby reducing the layout area of a power feed cell. In other words, the layout area of the memory array can be further reduced as a whole by reducing the layout area of a power feed cell.

Then, in addition, in power feed cell PMCa in accordance with the second embodiment of the present invention, the layout area can be reduced as compared with power feed cell PMC in the first embodiment.

Figure 9:
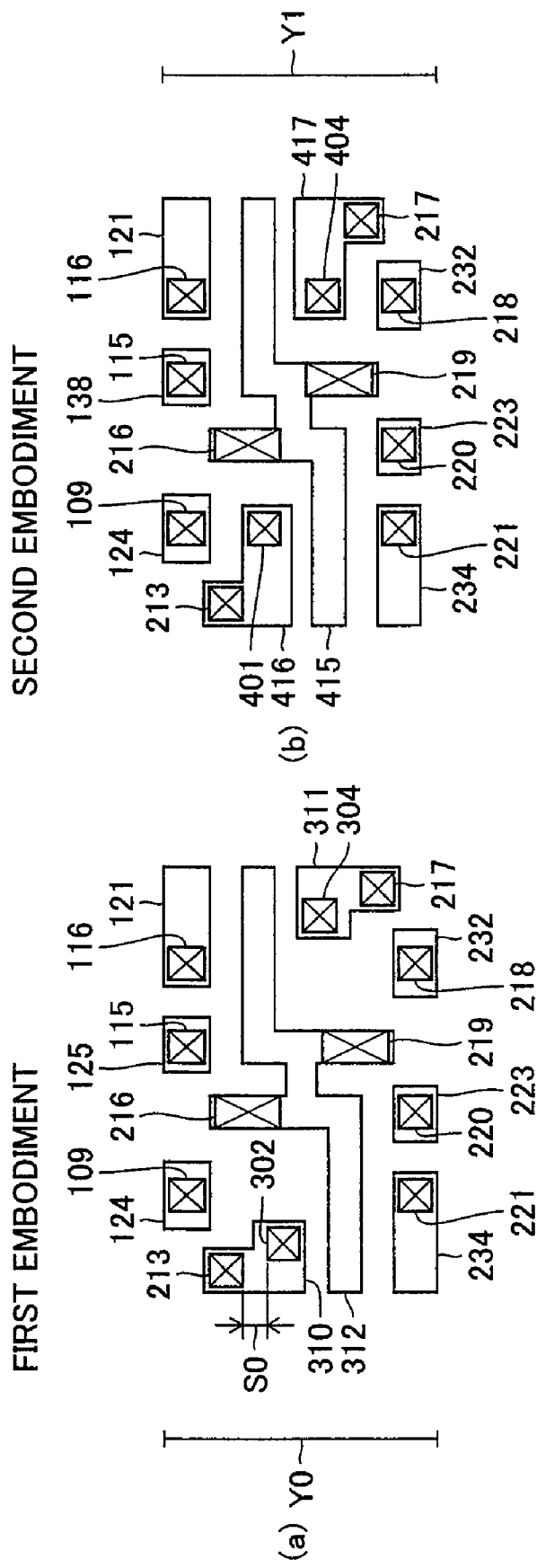
FIG. 9 is a diagram in which the layouts of metals in the first layer of the power feed cells in accordance with the first and second embodiments of the present invention are compared to each other.

Using FIG. 9, a comparison between the layouts of metals in the first layer of the power feed cells in accordance with the first and second embodiments of the present invention will be described.

Here, a metal portion in the first metal interconnection layer in FIG. 4(b) is shown corresponding to FIG. 9(a). In addition, a metal portion in the first metal interconnection layer shown in FIG. 8(b) is shown corresponding to FIG. 9(b).

As shown in FIG. 9(a), in the configuration in accordance with power feed cell PMC of the first embodiment in FIG. 4, active region 301 provided in a power feed cell is independent from polysilicon interconnection line 225 and active region 100 and needs to be disposed with a prescribed spacing in order to secure a layout margin, so that metal 310 formed in the first metal interconnection layer to electrically couple contact 213 and contact 302 needs to be formed to extend along the Y direction by a length 50 corresponding to the prescribed spacing. However, in the configuration in accordance with power feed cell PMCa in accordance with the second embodiment of the present invention, the active region used in memory cell MC in the upper region is shared, and the gate-isolated active region is used to dispose a contact with a power supply line supplying P well voltage VSSB to be fed to the P well facing the power feed cell, so that there is no need for securing a layout margin. Thus, such a layout configuration can be realized in that the length corresponding to the prescribed spacing is reduced along the Y direction in metal 416 which electrically couples contact 213 and contact 401. In short, in the configuration in accordance with power feed cell PMCa in accordance with the second embodiment of the present invention, the layout can be shrunken along the Y direction by the amount corresponding to the layout margin of the active region provided in the power feed cell.

Therefore, in the configuration of power feed cell PMCa in the second embodiment of the present invention, the length in the Y direction can be designed at Y1 (<Y0), where the length in the Y direction of power feed cell PMC in the first embodiment of the present invention is Y0. Thus, the layout area of a power feed cell can be further reduced and in addition, the layout area of the memory array can be further reduced as a whole.

Third Embodiment

Using FIG. 10, a layout pattern of memory cells and power feed cells of a memory array in accordance with a third embodiment of the present invention will be described.

Figure 10:
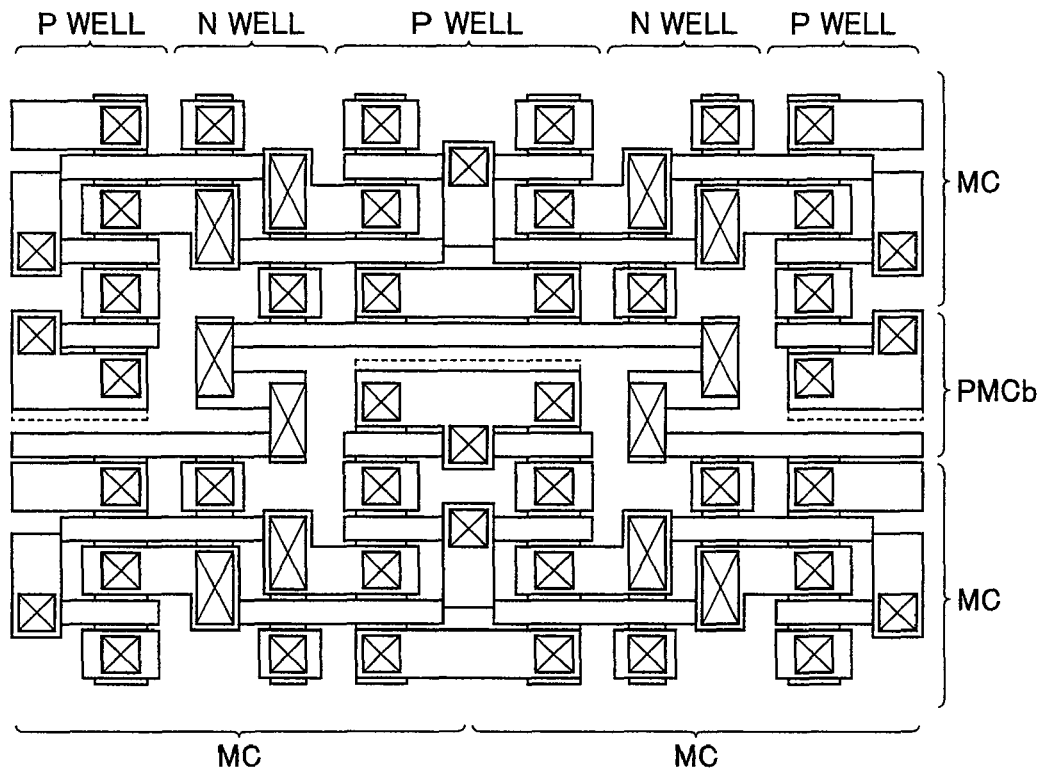
FIG. 10 illustrates a layout pattern of memory cells and power feed cells of a memory array in accordance with a third embodiment of the present invention.

Referring to FIG. 10, here, a power feed cell PMCb is provided between two memory cells MC correspondingly to a column, and four memory cells MC and two power feed cells PMCb are shown. Furthermore, a P well region and an N well region in which active regions for forming memory cell MC and power feed cell PMCb are disposed are alternately disposed in the row direction, namely in the X direction to extend in the column direction, namely in the Y direction.

The layout of memory cell MC and power feed cell PMCb which is reflective symmetric with respect to the boundary region is repeatedly arranged. Memory cell MC and power feed cell PMCb have active regions and interconnection lines disposed in reflective symmetry in the Y direction. Although not shown here, in a memory cell column, active regions and interconnection lines are disposed in reflective symmetry in the X direction between adjacent memory cells MC.

Using FIG. 11, a part of the cell layout shown in FIG. 10 will be described.

Figure 11:
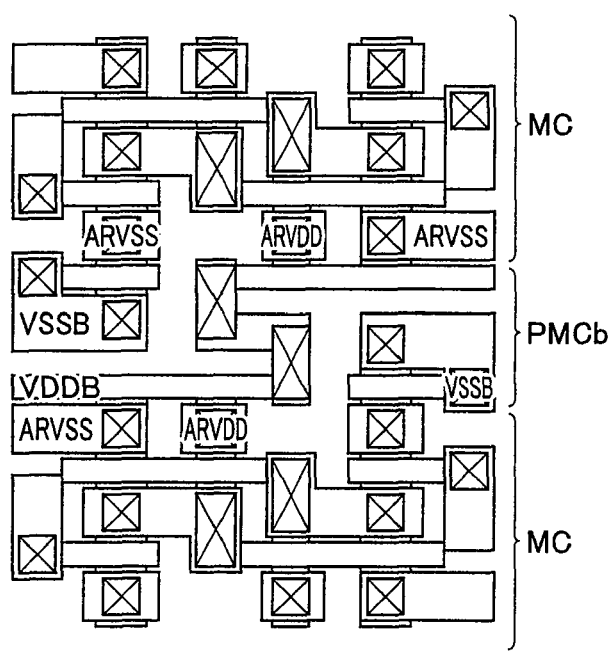
FIG. 11 illustrates a part of the cell layout shown in FIG. 10.

Referring to FIG. 11, shown here are two memory cells MC and power feed cell PMCb provided therebetween in a memory cell column. Here, the layout pattern of memory cell MC is similar to that illustrated in FIG. 20. Therefore, a detailed description of the same parts will not be repeated and the same parts will be denoted with the same reference characters.

In the following, the layout pattern of power feed cell PMCb in accordance with the third embodiment of the present invention will be described. Here, a configuration in which a dummy polysilicon interconnection line is used to supply P well voltage VSSB will be described.

Using FIG. 12, a layout pattern of power feed cell PMCb in accordance with the third embodiment of the present invention will be described.

FIG. 12(a) shows a layout pattern of an underlying portion of power feed cell PMCb.

Here, as described above, an N-type N well region is disposed to linearly extend in the Y direction, and P-type P well regions are disposed on opposite sides of the N well region. These N well region and P well regions are arranged extending in the column direction to be shared with memory cell MC, and a power feed cell for executing well feed is formed using transistor formation active regions formed as a dummy layout pattern in these N well region and P well regions.

Then, in the P well regions of power feed cell PMCb in accordance with the third embodiment of the present invention, the active regions used in the memory cells MC adjacent to the upper region and the lower region are disposed to extend further as illustrated in the second embodiment. Specifically, active regions 100# and 201# are disposed to extend to the P well regions of power feed cell PMCb. Here, shown are active region 100# bent such that an L-shaped active region is reflective-symmetric along the Y direction and active region 200# bent such that an L-shaped active region is reflective-symmetric along the X direction. Active regions 100# and 201# are isolated by dummy polysilicon interconnection lines 225, 223, respectively.

Then, in a region (isolation active region) of active region 100#, which is isolated by dummy polysilicon interconnection line 225, contact 401 is disposed for establishing contact with a power supply line supplying P well voltage VSSB to be fed to the P well. On the other hand, in a region (isolation active region) of active region 201#, which is isolated by dummy polysilicon interconnection line 223, contact 404 is disposed for establishing contact with a power supply line supplying P well voltage VSSB to be fed to the P well.

Here, the region surrounded with the dotted line as shown is a region in which P-type ion implantation is performed on a part of active regions 100# and 201# in the P well regions. The region not surrounded with a dotted line is subjected to N-type ion implantation.

Figure 8:
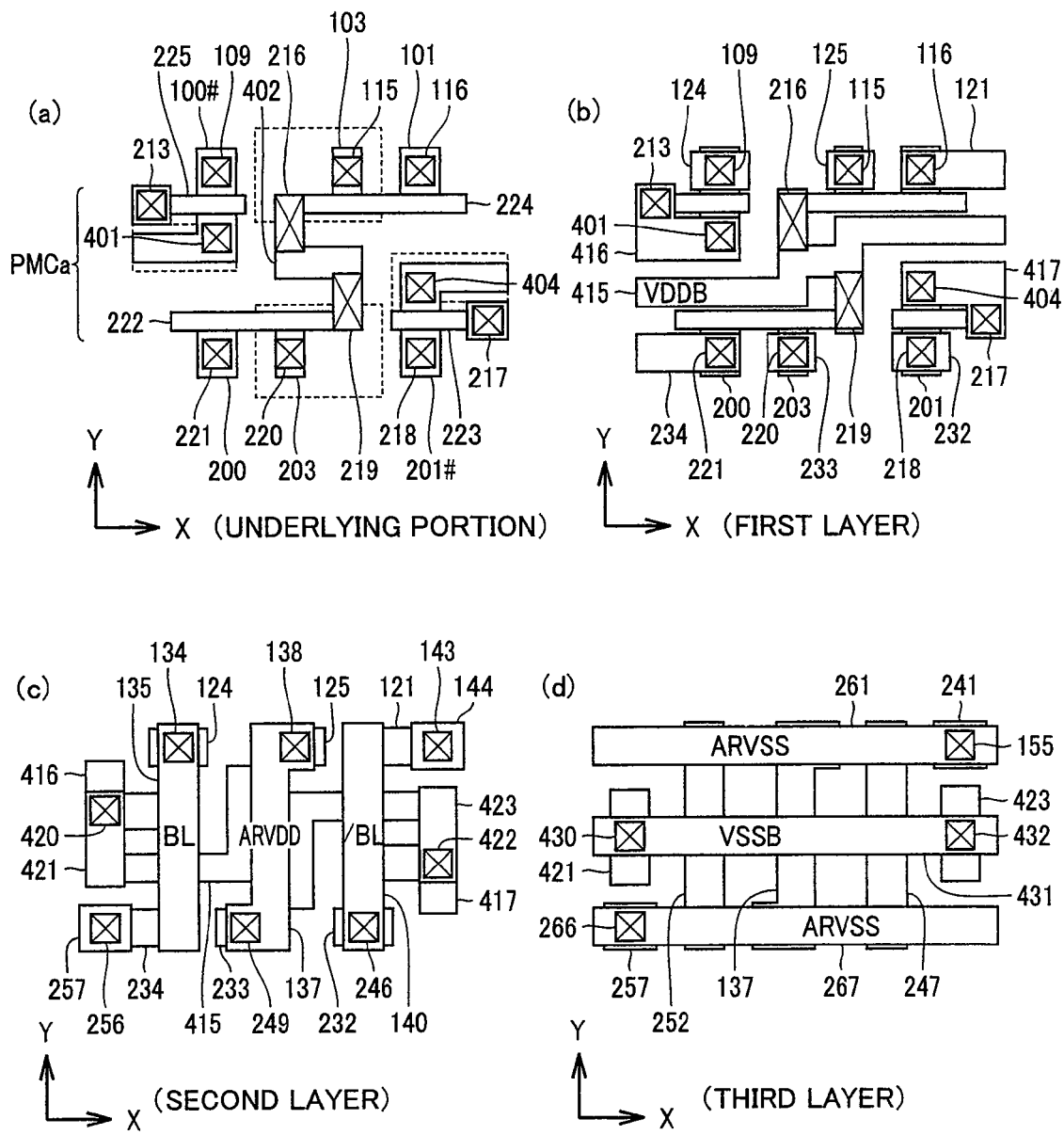
FIG. 8 illustrates a layout pattern of the power feed cell in accordance with the second embodiment of the present invention.

As compared with the layout pattern as illustrated in FIG. 8, there are differences in that dummy active region 402 is replaced by a dummy active region 500, and in that dummy polysilicon interconnection lines 222 and 224 are replaced by dummy polysilicon interconnection lines 222# and 224#, respectively. The other configuration is similar to that illustrated in FIG. 8.

Dummy active region 500 is configured in such a manner that the length in the Y direction is reduced and the distance between shared contacts 216 and 219 is reduced thereby reducing the length in the Y direction of the underlying region of a power feed cell.

It is assumed that dummy polysilicon interconnection lines 222# and 224# are disposed to extend to the regions of the power feed cells adjacent in the X direction and are laid out to be shared with each other.

FIG. 12(b) shows a layout pattern up to the first metal interconnection layer of power feed cell PMCb.

As shown in FIG. 12(b), in the first layer, metal 416 is provided which is electrically connected to contact 213 and contact 401. Furthermore, a metal 505 is provided which is electrically connected to shared contacts 216 and 219. In addition, metal 417 is provided which is electrically connected to contact 404 and contact 217. This metal 505 is provided to electrically couple only shared contacts 216 and 219 of a corresponding power feed cell PMCb to each other and is not formed to extend to electrically couple shared contacts 216 and 219 of the adjacent power feed cells to each other using the metal in the first layer as illustrated in the first and second embodiments.

Power feed cell PMCb in accordance with the third embodiment of the present invention uses a dummy polysilicon interconnection line shared between power feed cells adjacent to each other in the X direction to supply N well voltage VDDB. Specifically, in FIG. 12(b), polysilicon interconnection lines 222# and 224# are used to supply N well voltage VDDB.

As described above, in the upper region, in the boundary region between the upper adjacent memory cell MC and the power feed cell which constitute the same column, the metals connected through contacts of memory cell MC in the column direction are denoted by the same reference characters and are similar to those illustrated in FIG. 20(b), and thus a detailed description thereof will not be repeated.

Similarly, in the lower region, in the boundary region between the lower adjacent memory cell MC and the power feed cell which constitute the same column on the lower side, the metals connected through contacts of the lower adjacent memory cell MC are denoted by the same reference characters and are similar to those illustrated in FIG. 21(b), and thus a detailed description thereof will not be repeated.

FIG. 12(c) shows a layout pattern up to the second metal interconnection layer of power feed cell PMCb.

As shown in FIG. 12(c), in the second layer, a metal 502 is provided which is electrically coupled to metal 416 through a contact 501. Furthermore, a metal 504 is provided which is electrically coupled to metal 417 through a contact 507.

As for the upper region, in the boundary region between the upper adjacent memory cell MC and the power feed cell which constitute the same column, metal 135 which forms bit line BL electrically coupled through contact 134 of memory cell MC illustrated in FIG. 20(c) is disposed to extend along the Y direction. Furthermore, metal 137 which forms a power supply line supplying voltage ARVDD electrically coupled through contact 138 of memory cell MC is disposed to extend along the Y direction. Similarly, metal 140 which forms bit line /BL of memory cell MC is disposed to extend along the Y direction.

Similarly, in the boundary region between the lower adjacent memory cell MC and the power feed cell which constitute the same column on the lower side, metal 234 and metal 257 are electrically coupled to each other through contact 256 illustrated in FIG. 21(c). Furthermore, metal 233 and metal 137 are electrically coupled to each other through contact 249. In addition, metal 232 and metal 140 are electrically coupled to each other through contact 246.

FIG. 12(d) shows a layout pattern up to the third metal interconnection layer of power feed cell PMCb.

As shown in FIG. 12(d), in the third layer, a shared metal 510 is provided which is electrically coupled to metals 502 and 504 through contacts 508 and 509, respectively. This metal 510 forms a power supply line supplying P well voltage VSSB.

As for the upper region, in the boundary region between the upper adjacent memory cell MC and the power feed cell which constitute the same column, metal 156 which forms a power supply line supplying voltage ARVSS electrically coupled through contact 155 of memory cell MC illustrated in FIG. 20(d) is disposed to extend along the X direction.

On the other hand, as for the lower region, in the boundary region between the lower adjacent memory cell MC and the power feed cell which constitute the same column on the lower side, metal 257 is electrically coupled to metal 267 through contact 266. This metal 267 is disposed to extend along the X direction as a power supply line supplying voltage ARVSS provided for the lower adjacent memory cell MC.

In short, in this configuration, as for N well voltage VDDB, the well voltage is supplied through a path of polysilicon interconnection line 222#—contact 219—dummy active region 500. On the other hand, as for P well voltage VSSB, the well voltage is supplied through a path of metal 510—contacts 509, 508—metals 504, 502, contacts 507, 501—metals 417, 416—contacts 404, 401—the gate-isolated active regions 201#, 100# (isolation active regions).

In this configuration, the power supply line supplying N well voltage VDDB is formed using a polysilicon interconnection layer, so that a piling region from the third layer to the underlayer is not required and it is only necessary to secure a piling region for a power supply line for P well voltage VSSB.

Accordingly, although in the conventional power feed cell, the length in the Y direction cannot be reduced in order to secure two different piling regions along the Y direction as described above, the present configuration only requires an area for one piling region, so that the length in the Y direction of power feed cell PMC can be reduced thereby reducing the layout area of a power feed cell. In other words, the layout area of the memory array can be further reduced as a whole by reducing the layout area of a power feed cell.

Then, in addition, in power feed cell PMCb in accordance with the third embodiment of the present invention, the layout area can be reduced as compared with power feed cell PMC in the first embodiment.

Figure 13:
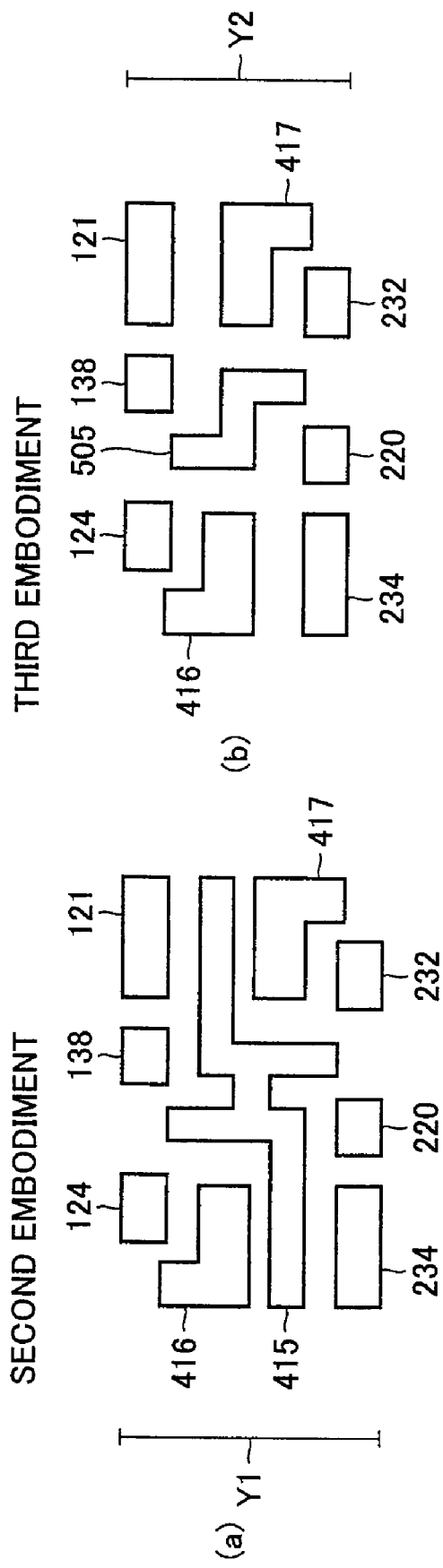
FIG. 13 is a diagram in which the layouts of metals in the first layer of the power feed cells in accordance with the second and third embodiments of the present invention are compared to each other.

Using FIG. 13, a comparison between the layouts of metals in the first layer of the power feed cells in accordance with the second and third embodiments of the present invention will be described.

Here, a metal portion in the first metal interconnection layer in FIG. 8(b) is shown corresponding to FIG. 13(a). In addition, a metal portion in the first metal interconnection layer shown in FIG. 12(b) is shown corresponding to FIG. 13(b).

As shown in FIG. 13(a), in the configuration in accordance with power feed cell PMCa of the second embodiment in FIG. 8, such a configuration is employed in that N well voltage VDDB is supplied to the N well using metal 415 provided in the first metal interconnection layer. Specifically, N well voltage VDDB is supplied to the N well by electrically coupling active region 402 provided in the underlying portion to metal 415 using contacts 216 and 219. However, in the configuration in accordance with the third embodiment of the present invention, polysilicon interconnection lines 222# and 224# shared with the adjacent power feed cells are used to supply N well voltage VDDB. Metal 505 is a metal interconnection line underlaid to restrain wiring resistance of the polysilicon interconnection line by electrically coupling contacts 216 and 219 to each other. More specifically, as for power feed cell PMCb provided along the X direction, N well voltage VDDB is supplied to active region 500 through shared contact 219 from one polysilicon interconnection line 222#, and in addition, N well voltage VDDB is supplied to the other polysilicon interconnection line 224# through shared contact 219 electrically coupled to active region 500 and metal 505 so that N well voltage VDDB is supplied to the adjacent power feed cell through the other polysilicon interconnection line 224#.

This configuration eliminates the need for disposing a shared metal interconnection line in the first layer for supplying N well voltage VDDB and eliminates the need for securing a layout margin for disposing a shared metal interconnection line, so that such a layout configuration can be realized in that the length for laying out a metal interconnection line is reduced. In other words, in the configuration in accordance with power feed cell PMCa in accordance with the second embodiment of the present invention, the layout can be shrunken along the Y direction by an amount corresponding to the shared metal interconnection line in the first layer. For example, the length in the Y axis direction of the power feed cell of the third embodiment can be designed at Y2 (<Y1), where the length in the Y axis direction of the power feed cell of the second embodiment is Y1. Thus, the layout area of a power feed cell can be further reduced, and in addition, the layout area of the memory array can be further reduced as a whole.

Fourth Embodiment

In a fourth embodiment of the present invention, a manner of further enhancing the well voltage to be supplied to a power feed cell using a power supply line provided corresponding to a dummy memory cell will be described. Here, a manner of enhancing N well voltage VDDB will be described.

Using FIG. 14, memory cells and power feed cells integrated and arranged in a matrix of a memory array in accordance with the fourth embodiment will be described.

Figure 14:
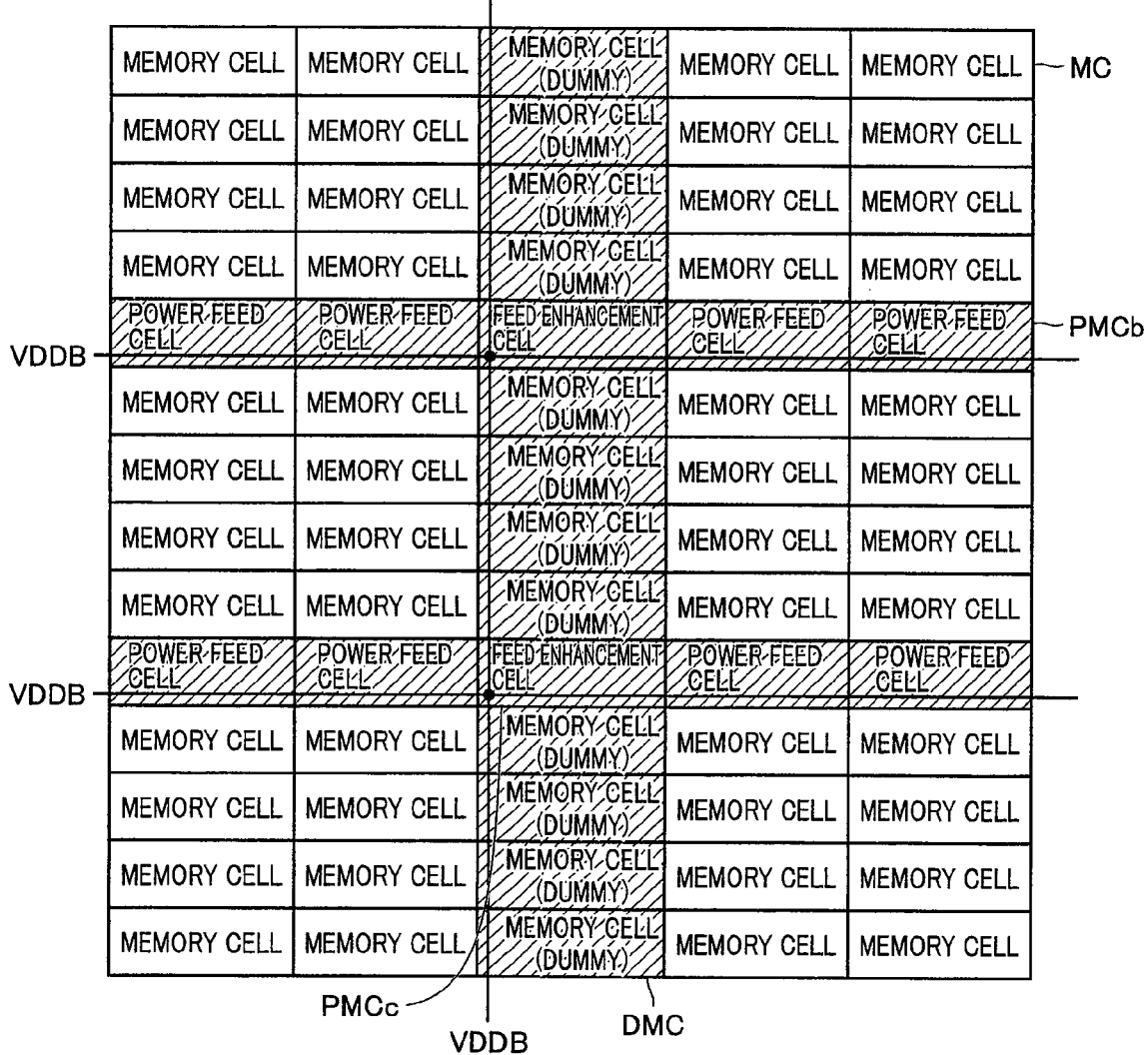
FIG. 14 illustrates memory cells and power feed cells integrated and arranged in a matrix in a memory array in accordance with a fourth embodiment of the present invention.

Referring to FIG. 14, here, a power feed cell row is provided corresponding to four memory cell rows and a dummy memory cell column is provided corresponding to prescribed memory cell columns.

It is assumed that dummy memory cells DMC which constitute a dummy memory cell column do not operate as normal memory cells and are not provided with contact with a power supply line. Specifically, in the layout pattern of memory cells in FIG. 20, contacts 136 and 138 with metal 137 are not provided for dummy memory cell DMC.

Here, a power feed cell which corresponds to a dummy memory cell column and further enhances a well voltage (feed enhancement cell) will be described. Here, a power feed cell PMCc will be described as an example, in which the layout pattern of power feed cell PMCb in accordance with the third embodiment is modified. The other power feed cells are power feed cells in accordance with the third embodiment of the present invention and are similar to those as illustrated above, and thus a detailed description thereof will not be repeated.

Figure 15:
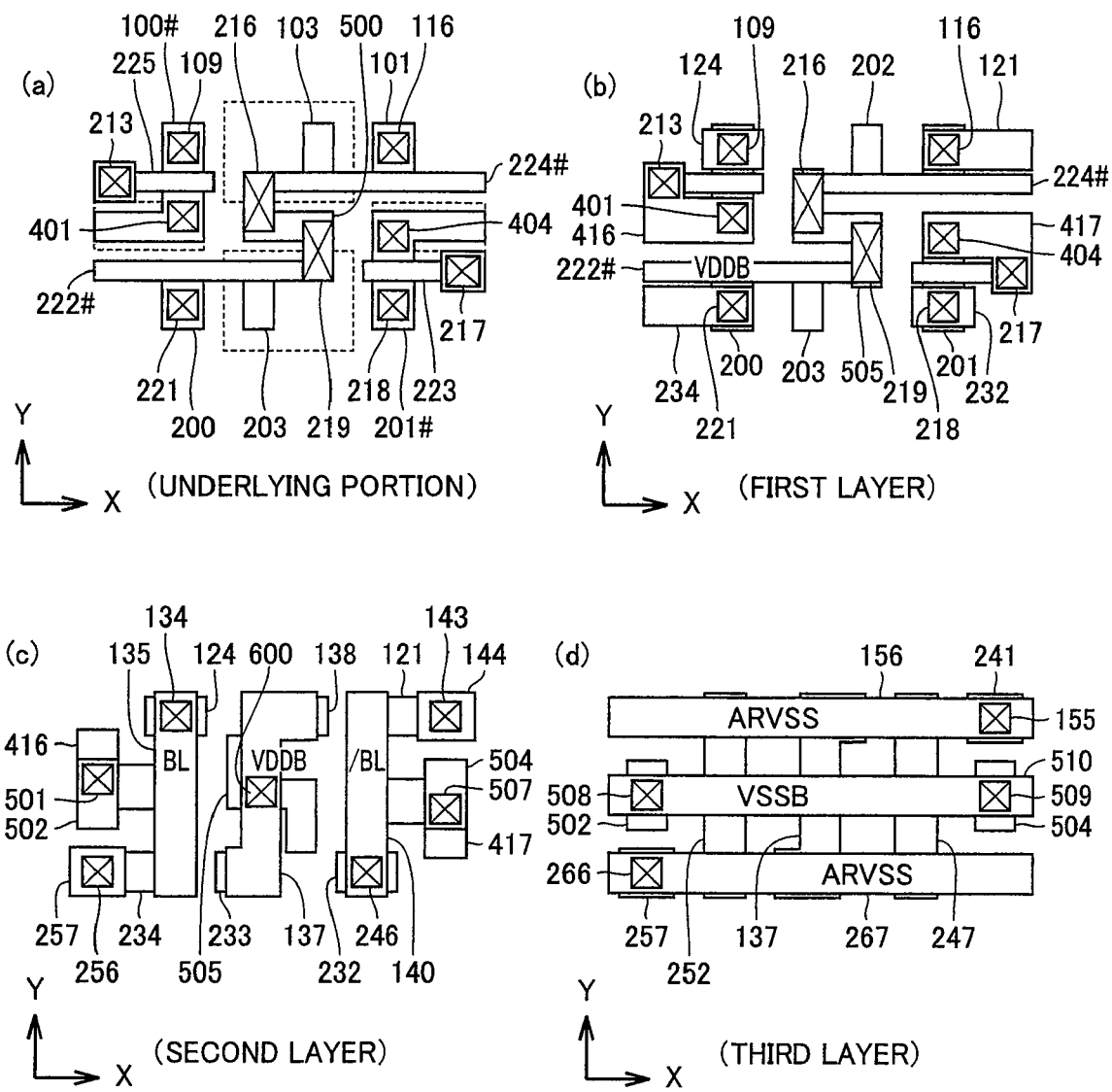
FIG. 15 illustrates a layout pattern of a feed enhancement cell in accordance with the fourth embodiment of the present invention.

Using FIG. 15, a layout pattern of feed enhancement cell PMCc in accordance with the fourth embodiment of the present invention will be described.

FIG. 15(a) shows a layout pattern of an underlying portion of power feed cell PMCc.

Figure 12:
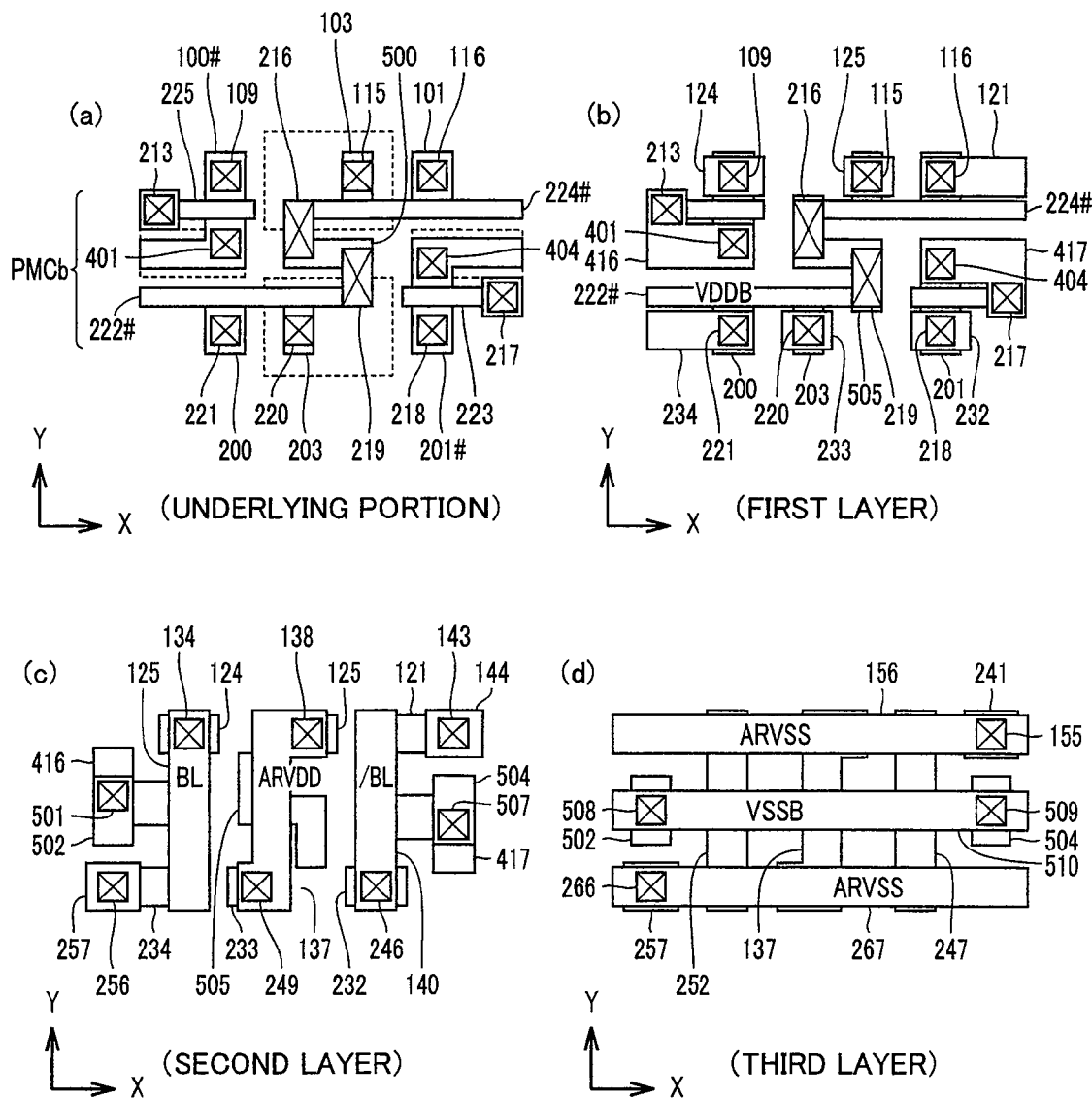
FIG. 12 illustrates a layout pattern of the power feed cell in accordance with the third embodiment of the present invention.

As compared with power feed cell PMCb illustrated in FIG. 12, there is a difference in that contacts 115 and 220 which establish contact with voltage ARDVV of the memory cells adjacent to the upper region and the lower region are deleted. The other configuration is the same.

FIG. 15(b) shows a layout pattern up to the first metal interconnection layer of power feed cell PMCc.

As compared with power feed cell PMCb illustrated in FIG. 12, there is a difference in that metals 125, 233 and contacts 115, 220 for establishing contact with voltage ARVDD of the memory cells MC adjacent to the upper region and the lower region are deleted. The other configuration is the same.

FIG. 15(c) shows a layout pattern up to the second metal interconnection layer of power feed cell PMCc.

As compared with power feed cell PMCb illustrated in FIG. 12, there is a difference in that metal 505 and metal 137 are electrically coupled through contact 600. This metal 137 is formed as a power supply line supplying N well voltage VDDB.

FIG. 15(d) shows a layout pattern up to the third metal interconnection layer of power feed cell PMCc, which has a similar configuration to that illustrated in FIG. 12.

In summary, in this configuration, as for N well voltage VDDB, the well voltage is supplied through a path of polysilicon interconnection line 222#—contact 219—contact 600—dummy active region 500, and in addition, the well voltage is supplied through a path of metal 137—contact 600—metal 505—contacts 216, 219—active region 500.

In this configuration, as for feed enhancement cell PMCc, the power supply line supplying N well voltage VDDB is formed using not only a polysilicon interconnection line but also a power supply line provided corresponding to a dummy memory cell column, so that the well voltage which is further enhanced can be supplied.

In the fourth embodiment, the layout pattern of the feed enhancement cell has been described using the layout pattern of power feed cell PMCb in accordance with the third embodiment. However, without being limited to power feed cell PMCb in accordance with the third embodiment, a feed enhancement cell may be designed in a similar manner using the layout patterns of the power feed cells in accordance with the first and second embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory array having a plurality of memory cells arranged in a matrix of rows and columns, each including
a first and a second P-channel MOS load transistors formed in a N well region,
a first N-channel MOS diver transistor formed in a first P well region, connected to said first P-channel MOS load transistor to configure a first inverter,
a second N-channel MOS diver transistor formed in a second P well region, connected to said second P-channel MOS load transistor to configure a second inverter,
a first N-channel MOS access transistor formed in said first P well region, connected to said first inverter, and
a second N-channel MOS access transistor formed in said second P well region, connected to said second inverter, and
a plurality of power feed cells, each provided corresponding to a memory cell column, which constitute a row provided to feed said first P well region, said second P well region and said N well region in a row direction to extend in a column direction respectively, wherein
a first power supply line provided corresponding to said plurality of power feed cells along the row direction and electrically coupled to said power feed cell to supply a first power supply voltage to said N well region;
a second power supply line provided corresponding to said plurality of power feed cells along the row direction and electrically coupled to said power feed cell to supply a second power supply voltage to said first and second P well regions,
a third power supply line provided corresponding to said plurality of memory cells along the row direction and electrically coupled to said power feed cell to supply a third power supply voltage to said first and second P-channel MOS load transistors, and
a forth power supply line provided corresponding to said plurality of memory cells along the row direction and electrically coupled to said power feed cell to supply a forth power supply voltage to said first and second N-channel MOS driver transistors, wherein
said first power supply line is formed in a first metal interconnection layer,
said third power supply line is formed in a second metal interconnection layer above said first connection layer, and
said second and forth power supply lines are formed in a third metal interconnection layer above said second connection layer.

2. A semiconductor memory device comprising:
a memory array having a plurality of memory cells arranged in a matrix of rows and columns, each including
a first and a second P-channel MOS load transistors formed in a N well region,
a first N-channel MOS diver transistor formed in a first P well region, connected to said first P-channel MOS load transistor to configure a first inverter,
a second N-channel MOS diver transistor formed in a second P well region, connected to said second P-channel MOS load transistor to configure a second inverter,
a first N-channel MOS access transistor formed in said first P well region, connected to said first inverter, and a second N-channel MOS access transistor formed in said second P well region, connected to said second inverter, a plurality of bit lines arranged corresponding to each memory cell column, each having memory cells in a corresponding column connected, and a plurality of power feed cells, each provided corresponding to a memory cell column, which constitute a row provided to feed said first P well region, said second P well region and said N well region in a row direction to extend in a column direction respectively, wherein a first power supply line provided corresponding to said plurality of power feed cells along the row direction and electrically coupled to said power feed cell to supply a first power supply voltage to said N well region;

a second power supply line provided corresponding to said plurality of power feed cells along the row direction and electrically coupled to said power feed cell to supply a second power supply voltage to said first and second P well regions, said first power supply line is formed in a first metal interconnection layer, said bit lines are formed in a second metal interconnection layer above said first connection layer, and said second power supply line is formed in a third metal interconnection layer above said second connection layer.

* * * * *